US012795841B2

(12) United States Patent
Bian et al.

(10) Patent No.: US 12,795,841 B2
(45) Date of Patent: Nov. 10, 2026

(54) DISPLAY DEVICE

(71) Applicants: Beijing BOE Technology Development Co., Ltd., Beijing (CN); BOE Technology Group Co., Ltd., Beijing (CN)

(72) Inventors: Lupeng Bian, Beijing (CN); Hong Zhu, Beijing (CN); Xiaolin Liu, Beijing (CN); Xinqi Lin, Beijing (CN)

(73) Assignee: BEIJING BOE TECHNOLOGY DEVELOPMENT CO. , LTD., Beijing (CN)

(*) Notice: Subject to any disclaimer, the term of this patent is extended or adjusted under 35 U.S.C. 154(b) by 272 days.

(21) Appl. No.: 18/697,011

(22) PCT Filed: Jun. 15, 2023

(86) PCT No.: PCT/CN2023/100458

§ 371 (c)(1),
(2) Date: Mar. 29, 2024

(87) PCT Pub. No.: WO2024/244064

PCT Pub. Date: Dec. 5, 2024

(65) Prior Publication Data

US 2026/0136478 A1 May 14, 2026

(30) Foreign Application Priority Data

May 26, 2023 (CN) ........................ 202310611278.1

(51) Int. Cl.
*H05K 5/00* (2025.01)
*H05K 5/02* (2006.01)

(52) U.S. Cl.
CPC ................................ *H05K 5/0217* (2013.01)

(58) Field of Classification Search
CPC ............................... H05K 1/0217; G06F 1/16
See application file for complete search history.

(56) References Cited

U.S. PATENT DOCUMENTS

| | | | | |
|---|---|---|---|---|
| 8,890,775 | B2 * | 11/2014 | Kobayashi | H04M 1/0268 345/204 |
| 9,195,272 | B2 * | 11/2015 | O'Brien | H04M 1/0268 |
| 9,286,812 | B2 * | 3/2016 | Bohn | G06F 1/1624 |

(Continued)

FOREIGN PATENT DOCUMENTS

| | | |
|---|---|---|
| CN | 106884867 A | 6/2017 |
| CN | 108665813 A | 10/2018 |

(Continued)

*Primary Examiner* — Allen L Parker
*Assistant Examiner* — Rashen E Morrison
(74) *Attorney, Agent, or Firm* — XSENSUS LLP

(57) ABSTRACT

A display device is provided. The display device includes: a fixed housing, a slide housing, a slide assembly, a connection assembly, and a flexible display panel; wherein the flexible display panel comprises a planar display portion and a curved display portion; the slide housing is slidably connected to the fixed housing, and the slide housing is capable of sliding relative to the fixed housing in a first direction away from the fixed housing or in a direction opposite to the first direction; the slide assembly comprises a first slideway and a second slideway; and the connection assembly comprises a first slide structure and a second slide structure.

18 Claims, 16 Drawing Sheets

(56) References Cited

U.S. PATENT DOCUMENTS

| | | | | |
|---|---|---|---|---|
| 10,321,583 | B2 * | 6/2019 | Seo | H04N 5/64 |
| 10,575,415 | B2 * | 2/2020 | Shin | H10K 59/40 |
| 10,817,030 | B2 * | 10/2020 | Pelissier | G06F 1/1641 |
| 10,845,850 | B1 * | 11/2020 | Kang | G06F 1/1681 |
| 10,880,417 | B1 * | 12/2020 | Song | H04M 1/0268 |
| 10,881,009 | B2 * | 12/2020 | Jiang | G06F 1/1624 |
| 11,003,219 | B1 * | 5/2021 | Kim | G06F 1/1652 |
| 11,315,443 | B2 * | 4/2022 | Han | G06F 1/1624 |
| 11,523,526 | B2 * | 12/2022 | Liu | H04M 1/0235 |
| 12,261,968 | B2 * | 3/2025 | Lee | G06F 1/1616 |
| 12,355,908 | B2 * | 7/2025 | Jung | H04M 1/0237 |
| 12,375,592 | B2 * | 7/2025 | Wang | H04M 1/0268 |
| 12,484,171 | B2 * | 11/2025 | Si | G06F 1/16 |
| 12,490,393 | B2 * | 12/2025 | Wang | G06F 1/1637 |
| 12,550,272 | B2 * | 2/2026 | Kim | G01D 5/145 |
| 2008/0053624 | A1 * | 3/2008 | Ito | E04F 10/0692<br>160/75 |
| 2011/0176260 | A1 * | 7/2011 | Walters | H04M 1/0268<br>361/679.01 |
| 2012/0162876 | A1 * | 6/2012 | Kim | G06F 1/1652<br>361/679.01 |
| 2015/0116921 | A1 * | 4/2015 | Hsu | G06F 1/1624<br>361/679.27 |
| 2018/0103550 | A1 * | 4/2018 | Seo | G06F 1/1601 |
| 2019/0230803 | A1 * | 7/2019 | Liao | A44C 5/00 |
| 2021/0181801 | A1 * | 6/2021 | Yin | G06F 1/1652 |
| 2021/0195008 | A1 * | 6/2021 | Lee | G06F 1/1652 |
| 2021/0373603 | A1 * | 12/2021 | Feng | G06F 1/1624 |

FOREIGN PATENT DOCUMENTS

| | | | |
|---|---|---|---|
| CN | 108831298 | A | 11/2018 |
| CN | 109272875 | A | 1/2019 |
| CN | 112908169 | A | 6/2021 |
| CN | 113098995 | A | 7/2021 |
| CN | 113990191 | A | 1/2022 |
| CN | 107919065 | B | 4/2022 |
| CN | 114501915 | A | 5/2022 |
| CN | 114677920 | A | 6/2022 |
| CN | 115424525 | A | 12/2022 |
| WO | 2022/025324 | A1 | 2/2022 |

* cited by examiner

DISPLAY DEVICE

CROSS-REFERENCE TO RELATED APPLICATIONS

This application is a U.S. national phase application based on PCT/CN2023/100458, filed on Jun. 15, 2023, which claims priority to Chinese Patent Application No. 202310611278.1, filed on May 26, 2023 and entitled "DISPLAY DEVICE", the contents of which are incorporated herein by reference in their entireties.

TECHNICAL FIELD

The present disclosure related the field of display technology, and in particular to a display device.

BACKGROUND

At present, the display device can use a flexible display panel as a display screen, and compared to a conventional display panel, the flexible display panel has advantages such as deformability, bendability, and better flexibility.

The flexible display panel in the display device is capable of being expanded or retracted under the drive of the housing, such that the display device has an expanded state and a retracted state and a size adjustment function of the display surface of the display device is realized.

SUMMARY

Embodiments of the present disclosure provide a display device. The technical solutions are as follows.

According to some embodiments of the present disclosure, a display device is provided. The display device includes: a fixed housing, a slide housing, a slide assembly, a connection assembly, and a flexible display panel;

- wherein the flexible display panel includes a planar display portion and a curved display portion, the planar display portion is connected to the fixed housing, the curved display portion partially covers an edge, away from the fixed housing, of the slide housing, one end of the curved display portion extends to a first side of the slide housing and is connected to the planar display portion, and the other end of the curved display portion extends to a second side, opposite to the first side, of the slide housing;
- the slide housing is slidably connected to the fixed housing and the slide housing is capable of sliding relative to the fixed housing in a first direction away from the fixed housing or in a direction opposite to the first direction;
- the slide assembly includes a first slideway and a second slideway, wherein the first slideway and the second slideway are disposed on the slide housing, and the first slideway and the second slideway extend from the first side to the second side of the slide housing; and
- the connection assembly includes a first slide structure and a second slide structure, wherein the first slide structure is connected to a central region on a backside of the curved display portion and is assembled on the first slideway, the second slide structure is slidably connected to an edge region on the backside of the curved display portion and is assembled on the second slideway, the central region includes a middle point of the flexible display panel in a second direction, the edge region includes an edge of the flexible display panel in the second direction, and the second direction is perpendicular to the first direction.

In some embodiments, the first slideway and the slide housing form a T-shaped space at a first cross-section, the first slide structure includes a T-shaped slide structure matching with the space, the T-shaped slide structure is disposed in the T-shaped space, and one end of the T-shaped slide structure is connected to the central region on the backside of the curved display portion, wherein the first cross-section is perpendicular to an extension direction of the first slideway.

In some embodiments, the first slideway includes two first U-shaped plates, wherein each of the first U-shaped plate includes a first strip plate, a connection plate and a second strip plate, the connection plate is connected to the first strip plate and the second strip plate, the first strip plate is disposed on the first side of the slide housing, and the second strip plate is disposed on the second side of the slide housing; and

- the two first U-shaped plates are arranged along the second direction, a first spacing is defined between the first U-shaped plates in the second direction, and the two first U-shaped plates and the slide housing enclose the T-shaped space.

In some embodiments, the slide assembly further includes a plurality of screws; and

- the slide housing includes a first strip fixed plate, a plurality of first through holes are disposed in the first strip fixed plate;
- wherein the plurality of screws pass through the first strip plate, the first through holes in the first strip fixed plate, and the second strip plate, such that the first U-shaped plate is connected to the slide housing.

In some embodiments, the fixed housing includes a plate body and an open groove disposed in the plate body, a third slideway is disposed on a groove wall of the open groove, and the third slideway extends in a direction parallel to the first direction; and

- the slide housing further includes a third slide structure, wherein the third slide structure extends into the open groove and is slidably connected to the third slideway.

In some embodiments, slide housing includes a first strip fixed plate, wherein a length direction of the first strip fixed plate is parallel to the first direction, the first strip fixed plate has two plate surfaces opposite to each other and side surfaces connected to the two plate surfaces, the first strip plate of the first U-shaped plate is disposed on an outer side of one of the plate surface, the second strip plate of the first U-shaped plate is disposed on an outer side of the other of the plate surface; and

- the third slide structure is disposed on a side of the first strip fixed plate.

In some embodiments, the fixed housing further includes a fourth slideway disposed on a plate surface of the plate body, and the fourth slideway extends in a direction parallel to the first direction; and

- the slide housing includes a fourth slide structure, and the fourth slide structure is assembled on the fourth slideway.

In some embodiments, the fourth slideway includes a plurality of strip grooves parallel to the first direction, the fourth slide structure includes a plurality of strip protrusions parallel to the first direction, and the plurality of strip protrusions are one-to-one engaged in the plurality of strip grooves.

In some embodiments, the slide housing includes a second strip fixed plate and a third strip fixed plate, the fourth slide structure is disposed on the second strip fixed plate, and the third strip fixed plate is connected to the second strip fixed plate and the first strip fixed plate.

In some embodiments, the slide housing includes a first sub-housing, a second sub-housing, and a third sub-housing;

wherein the first sub-housing and the third sub-housing are disposed on both sides of the second sub-housing respectively, the second sub-housing is connected to the first sub-housing and the third sub-housing, a number of the first slideways is two, and the two first slideways are disposed at a connection position between the first sub-housing and the second sub-housing and a connection position between the third sub-housing at a connection position and the second sub-housing respectively.

In some embodiments, the first slideway includes two second U-shaped plates, the second U-shaped plate includes a first strip plate, a connection plate, and a second strip plate, the connection plate is connected to the first strip plate and the second strip plate, the first strip plates of the two second U-shaped plates are parallel to each other, and the second strip plates of the two second U-shaped plates are parallel to each other; and the connection plates of the two second U-shaped plates of one first slideway are connected to an edge of the first sub-housing and an edge of the second sub-housing respectively, and the connection plates of the two second U-shaped plates of the other first slideway are connected to an edge of the third sub-housing and an edge of the second sub-housing respectively.

In some embodiments, each of the first sub-housing, the second sub-housing, and the third sub-housing includes a linkage and a plurality of restriction strips, one end of the plurality of restriction strips is connected to the linkage, the linkage of the first sub-housing, the linkage of the second sub-housing, and the linkage of the third sub-housing are end-to-end connected; and the fixed housing includes a plate body and a plurality of strip grooves disposed in the plate body, the plurality of restriction strips are one-to-one engaged in the plurality of strip grooves, and length directions of the restriction strips and the strip grooves are parallel to the first direction.

In some embodiments, the first slideway includes a first sub-slideway disposed on a first side of the slide housing, a second sub-slideway disposed on a second side of the slide housing, and two third U-plates covering edges of the slide housing, the first sub-slideway and the second sub-slideway are parallel to the first direction, and the third U-plate is connected to the first sub-slideway and the second sub-slideway; and each of the first sub-slideway and the second sub-slideway includes two strip support plates, a first gap is disposed between the two strip support plates in the second direction, the two strip support plates are parallel to each other, a second gap is disposed between the two strip support plates and the slide housing, a third gap is disposed between the third U-shaped plate and an edge of the slide housing, and a fifth gap is disposed between the two third U-shaped plates.

In some embodiments, the second slideway includes a slideway body and a U-shaped groove disposed on the slideway;

the U-shaped groove includes a first portion, a second portion and a third portion connected to the first portion and the second portion, the first portion and the second portion are parallel to the first direction, the third portion is disposed at an end, away from the fixed housing, of the slideway body, and the slideway body is connected to an edge of the slide housing.

In some embodiments, positioning holes and screw holes are disposed in the edge of the slide housing; and the second slideway further includes fixing screws, positioning protrusions disposed on the slideway body, and fixing through holes, the positioning protrusions are disposed in the positioning holes, and the fixing screws pass through the fixing through holes in the slideway body and are threadedly connected to the screw holes in the edge of the slide housing.

In some embodiments, a number of the second slideways is two, and the two second slideways are disposed at two edges of the slide housing in the second direction.

In some embodiments, the display device further includes a cover plate, the cover plate is fixedly connected to the slide housing; and the cover plate includes a back plate disposed outside a side, away from the slide housing, of a first portion of the curved display portion, the back plate is attached to the first portion, and the first portion is a portion of the curved display portion disposed on the second side of the slide housing.

In some embodiments, the cover plate further includes a curved portion, the curved portion is coupled to an edge of the back plate, and the curved portion covers a portion of the curved display portion partially covering the edge of the slide housing.

In some embodiments, numbers of the slide assemblies and the slide housings are both two, wherein the first slideway and the second slideway of the two slide assemblies are disposed on the two slide housings respectively, and the two slide housings are disposed on two sides of the fixed housing.

In some embodiments, the display device further includes a fifth slideway and a slider, wherein the fifth slideway is disposed on the fixed housing, the fifth slideway extends in a direction parallel to the first direction; and the slider is fixedly connected to the slide housing and the slider is assembled on the fifth slideway.

BRIEF DESCRIPTION OF DRAWINGS

In order to describe the technical solutions in the embodiments of the present disclosure more clearly, the following briefly describes the accompanying drawings required for describing the embodiments. Apparently, the accompanying drawings in the following description show merely some embodiments of the present disclosure, and those of ordinary skill in the art can still derive other drawings from these accompanying drawings without creative efforts.

The embodiments of the present application have been shown by the above accompanying drawings, which will be described in greater detail below. These accompanying drawings and textual descriptions are not intended to limit the scope of the conception of the present application in any way, but rather to illustrate the concepts of the present application for those skilled in the art by reference to particular embodiments.

DETAILED DESCRIPTION

In order to make the objects, technical solutions and advantages of the present disclosure clearer, embodiments of the present disclosure are described in further detail below in conjunction with the accompanying drawings.

Figure 1:
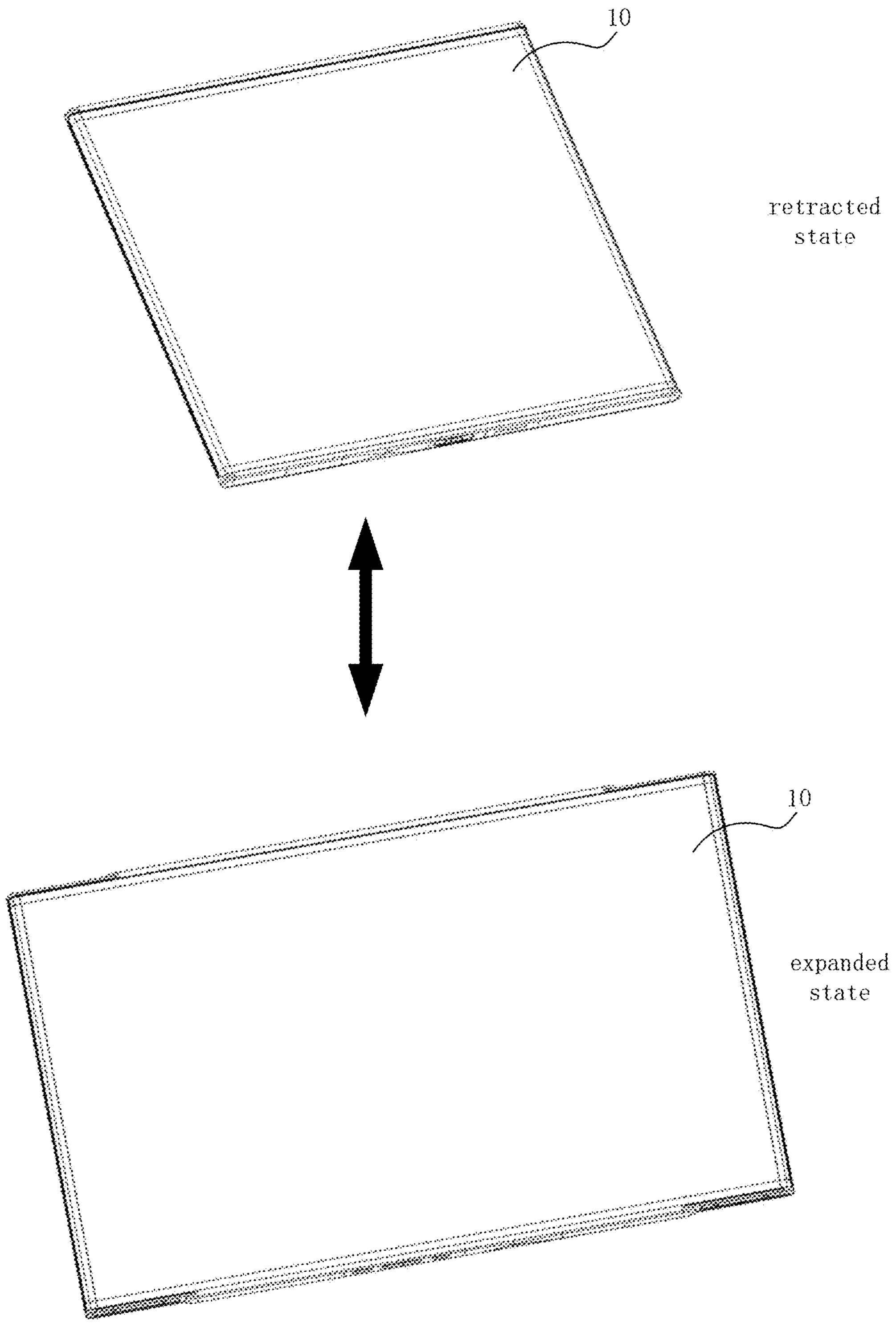
FIG. 1 is a schematic diagram of an effect of expanding and retracting a flexible display panel of a display device according to some embodiments of the present disclosure.

Referring to FIG. 1, FIG. 1 is a schematic diagram of the effect of expanding and retracting a flexible display panel in a display device according to some embodiments of the present disclosure. The display device includes a cell phone, a tablet computer, a television, a monitor, a laptop computer, a digital photo frame, a navigator, and other kinds of products or components with display, sliding and retracting functions.

As can be seen from FIG. 1, the display device according the embodiments of the present disclosure has two states, one state is an expanded state when the flexible display panel is unfolded, and the other state is a retracted state when the expanded flexible display panel is retracted. Compared to the retracted state, the display device has a larger display area in the expanded state, and compared to the expanded state, the display device has a smaller size and a less occupying space in the retracted state, which is easy to carry. By having these two states, the user experience of the display device is improved.

Figure 2:
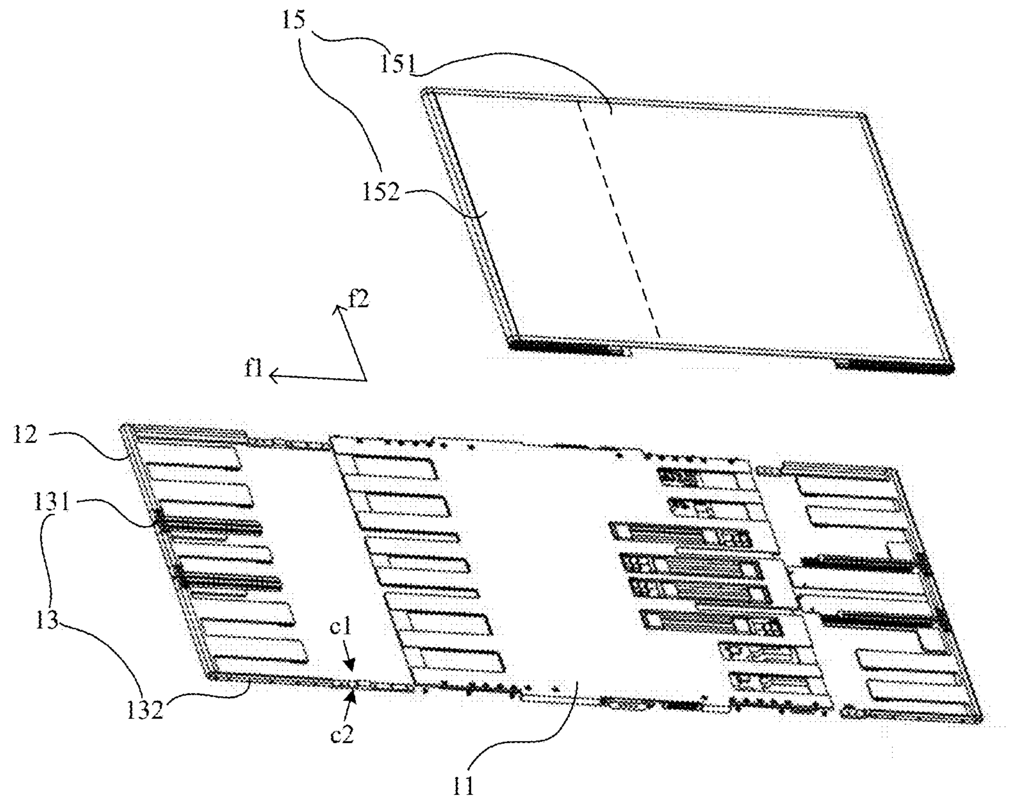
FIG. 2 is an exploded schematic diagram of a portion of the structure of the display device illustrated in FIG. 1.
Figure 3:
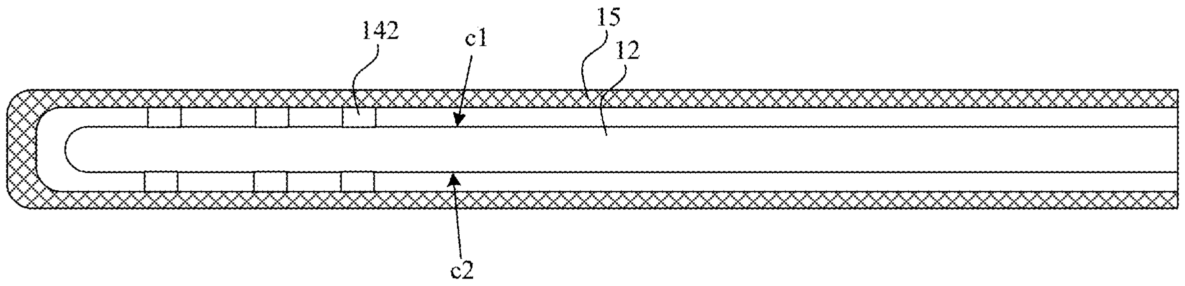
FIG. 3 is a schematic structural diagram of a side view of a portion of the structure of the display device illustrated in FIG. 2.

FIG. 2 is an exploded schematic diagram of a portion of the structure of the display device illustrated in FIG. 1. FIG. 3 is a schematic structural diagram of a side view of a portion of the structure of the display device illustrated in FIG. 2, and FIG. 4 is a schematic structural diagram of the back side of the flexible display panel in a flat state of the display device illustrated in FIG. 2.

Figure 4:
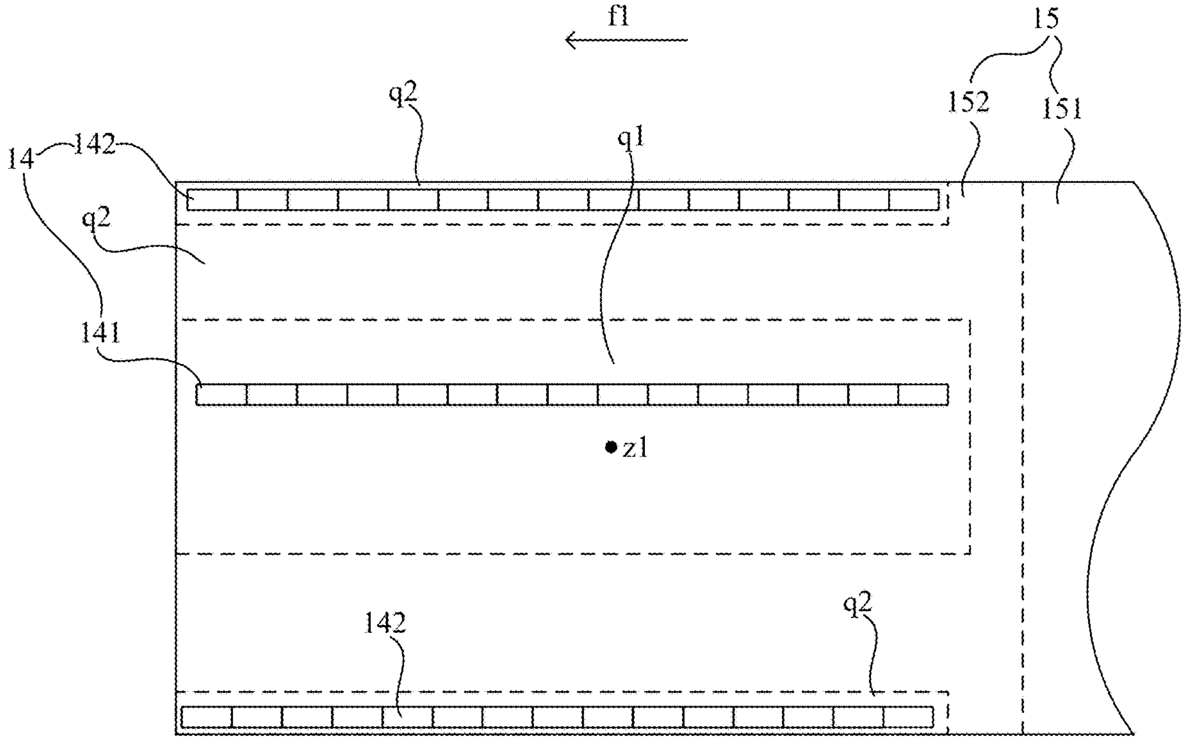
FIG. 4 is a schematic structural diagram of the back side of the flexible display panel in a flat state of the display device illustrated in FIG. 2.

Referring to FIG. 2, FIG. 3, and FIG. 4, the display device includes: a fixed housing 11, a slide housing 12, a slide assembly 13, a connection assembly 14, and a flexible display panel 15.

The flexible display panel 15 includes a planar display portion 151 and a curved display portion 152, the planar display portion 151 is connected to the fixed housing 11, the curved display portion 152 covers an edge, away from the fixed housing 11, of the slide housing 12, one end of the curved display portion 152 extends to the first side c1 of the slide housing 12 and is connected to the planar display portion 151, and the other end extends to the slide housing 12 extends to a second side c2, opposite to the first side c1, of the slide housing 12.

The slide housing 12 is slidably connected to the fixed housing 11, and the slide housing 12 is capable of sliding relative to the fixed housing 11 in a first direction f1 away from the fixed housing 11 or in a direction opposite to the first direction f1.

The slide assembly 13 includes a first slideway 131 and a second slideway 132. The first slideway 131 and the second slideway 132 are disposed on the slide housing 12, and the first slideway 131 and the second slideway 132 extend from the first side c1 to the second side c2 of the slide housing 12. Exemplarily, the extension track of the first slideway 131 and the second slideway 132 is U-shaped.

The connection assembly 14 includes a first slide structure 141 and a second slide structure 142, the first slide structure 141 is connected to a central region q1 on a backside of the curved display portion 152 and is assembled on the first slideway 131, and the second slide structure 142 is connected to an edge region q2 on the backside of the curved display portion 152 and is assembled on the second slideway, and the central region q1 includes a middle point of the flexible display panel 15 in a second direction f2, the edge region q2 includes an edge of the flexible display panel 15 in the second direction f2, and the second direction f2 is perpendicular to the first direction f1. The viewing line of sight of FIG. 4 may be parallel to the second direction.

In this structure, the first slide structure 141 on the back of the flexible display panel 15 can slide on the first slideway 131 in the extension direction of the first slideway 131, the second slide structure 142 can slide on the second slideway 132 in the extension direction of the second slideway 132 simultaneously, and the flexible display panel 15 is driven to be expanded or retracted. The first slide structure 141 restricts, under the constraint of the first slideway 131, phenomena such as creasing or bulging of the central region q1 of the flexible display panel 15 in the case that the flexible display panel 15 is expanded or retracted, and the second slide structure 142 restrict, under the constraint of the second slideway 132, phenomena such as creasing or warping of the edge region q2 of the flexible display panel 15 in the case that the flexible display panel 15 is expanded or retracted, such that the flatness of the central region q1 and the edge region q2 of the flexible display panel is enhanced, and the display effect of the display device is improved.

It should be noted that FIG. 4 shows a schematic diagram of the flexible display panel in a flat state, that is, the schematic diagram of the structure of the entire flexible display panel in the case that the flexible display panel is not retracted. In addition, the flexible display panel has a front side that displays an image and a back side opposite to the front side.

In summary, the display device according to the embodiments of the present disclosure is provided with a slide assembly including a first slideway and a second slideway, the first slideway is connected to the first slide structure in the central region of the backside of the curved display portion of the display panel, and the second slideway is connected to the second slide structure in the edge region of the backside of the curved display portion of the display panel. In this structure, in the case that the display panel is expanded and retracted, the first slideway can fit with the first slideway structure to restrict the central region of the display panel and enhance the flatness of the central region of the display panel, and the second slideway can fit with the second slideway structure to restrict the edge region of the display panel and enhance the flatness of the edge region of the display panel, such that the problem of poor display effect of the display device in the related art is solved, and the display effect of the display device in improved.

Figure 5:
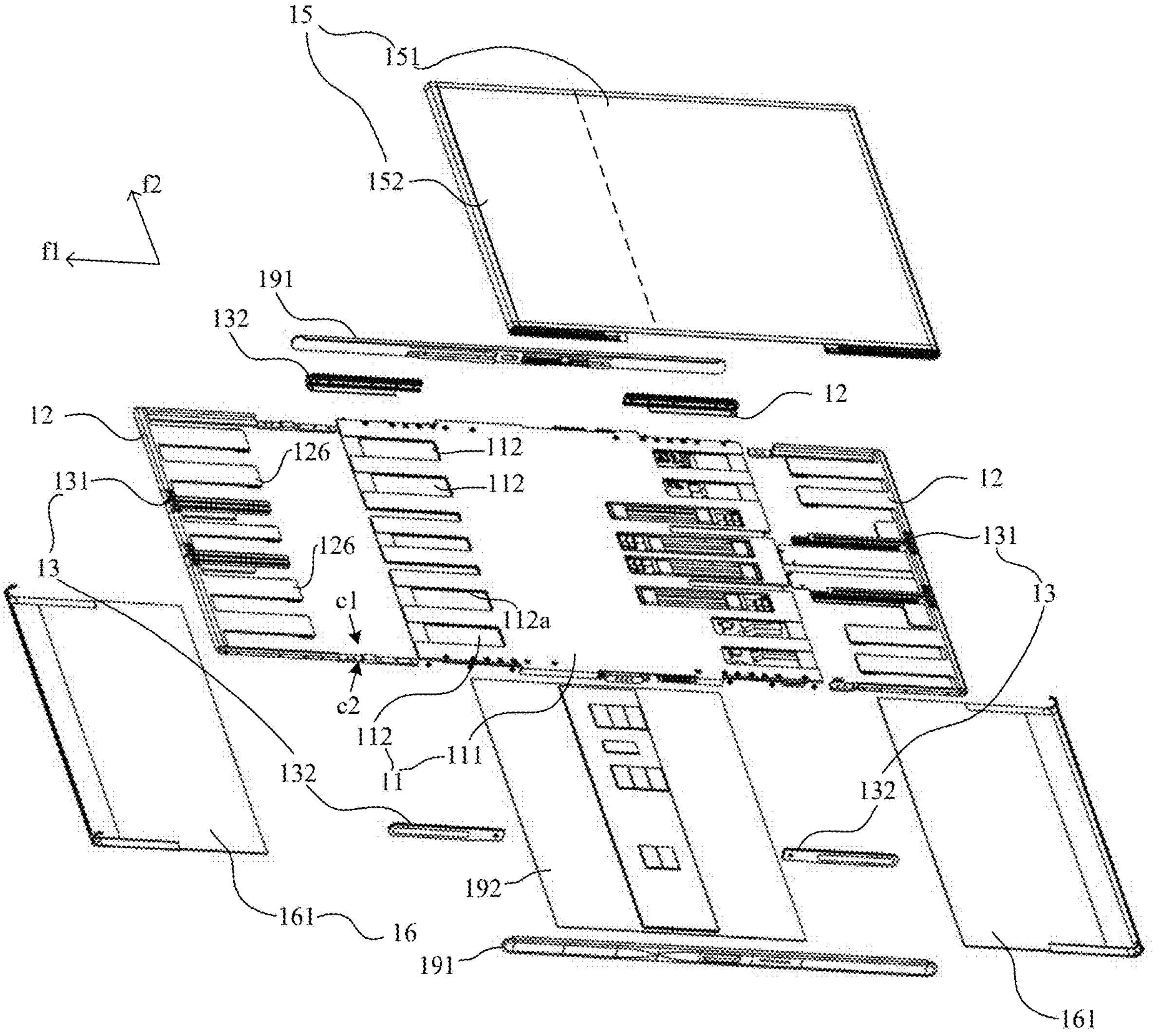
FIG. 5 is an exploded schematic diagram of a portion of a structure of another display device according to some embodiments of the present disclosure.
Figure 6:
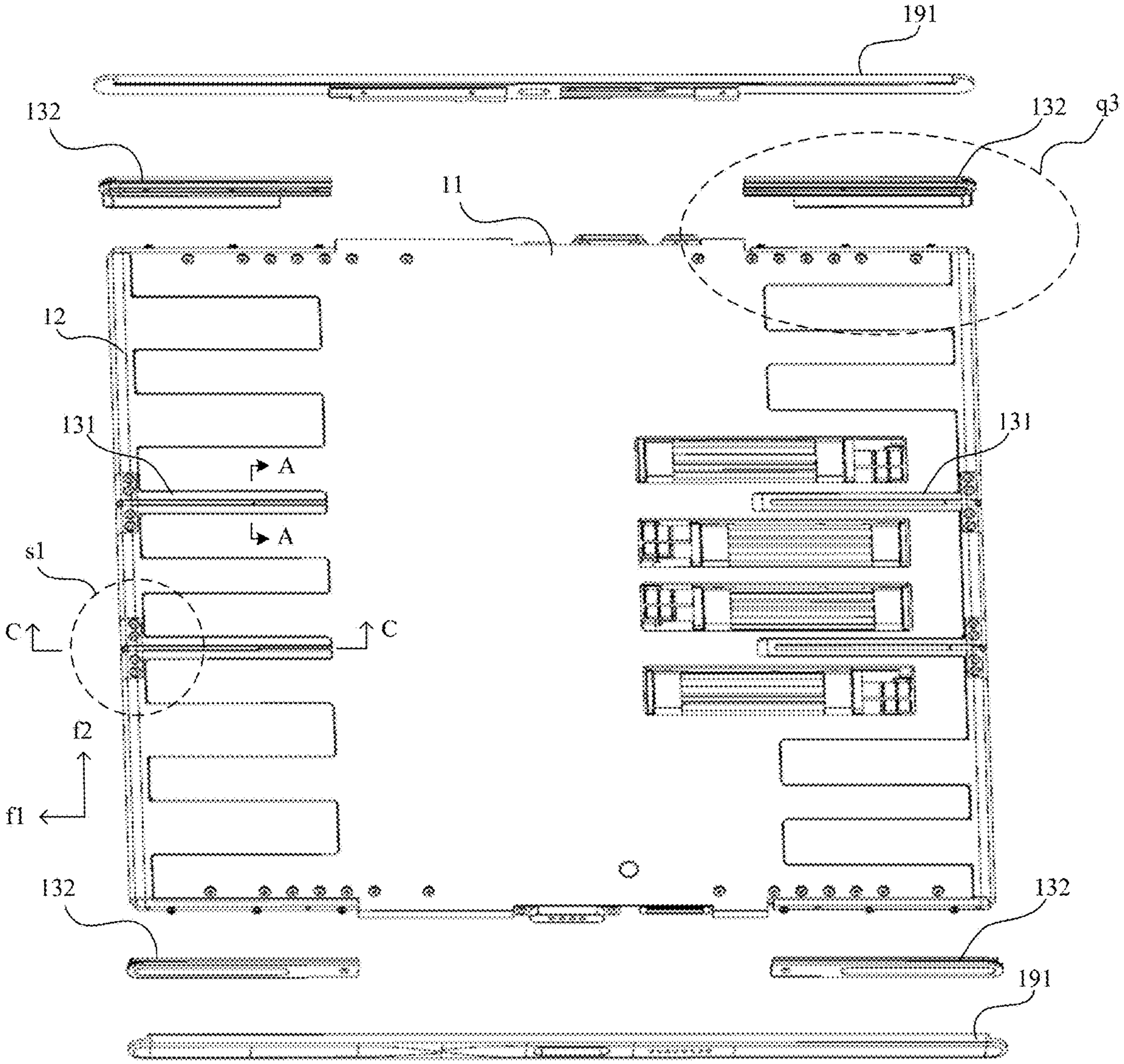
FIG. 6 is a schematic structural diagram of another view of a portion of the structure of the display device illustrated in FIG. 5.

FIG. 5 is an exploded schematic diagram of a portion of a structure of another display device according to some embodiments of the present disclosure. FIG. 6 is a schematic structural diagram of another view of a portion of the structure of the display device shown in FIG. 5, and FIG. 7 is a schematic structural diagram of a cross-section of a portion of the structure of the display device shown in FIG. 6 (the cross-section position is at A-A in FIG. 5).

Figure 7:
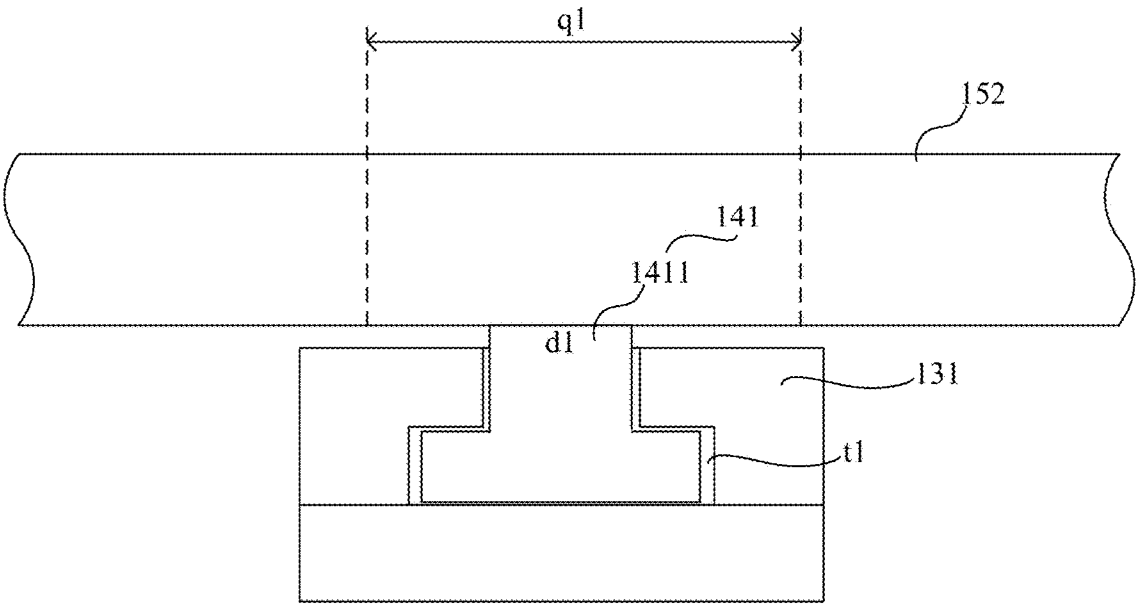
FIG. 7 is a schematic structural diagram of a cross-section of a portion of the structure of the display device illustrated in FIG. 6.

Referring to FIGS. 5, 6, and 7, the first slideway 131 and the slide housing 12 form a T-shaped space t1 at the first cross-section, and the first slide structure 141 includes a T-shape slide structure 1411 matching with the space, the T-shape slide structure 1411 is disposed in the T-shape space t1, one end d1 of the T-shape slide structure 1411 is connected to the central region on the back side of the curved display portion 152 q1, and the first cross-section is perpendicular to the extension direction of the first slideway. The first cross-section can be a surface overlapped with the cross-section shown in FIG. 7. It should be noted that in order to clearly illustrate the first slideway 131, structures such as the flexible display panel and the first slide structure are not shown in FIG. 6, but the embodiments of the present disclosure are not limited thereto. Exemplarily, the structure of the first slide structure 141 illustrated in FIG. 7 is disposed in the first slideway 131 and the flexible display panel 15.

The quantity of the first slideways 131 can be one or more, and FIG. 5 illustrates a case that the number of the first slideways 131 is two. Embodiments of the present disclosure are not limited herein.

In some exemplary embodiments, the numbers of slide assemblies and the slide housings are both two. The first slideway 131 and the second slideway 132 in the two slide assemblies 13 are disposed on the two slide housings 12, and the two slide housings 12 are disposed on the two sides of the fixed housing 11.

In this way, the display device can realize double-side sliding and expanding. Compared to the single-side sliding and expanding structure, the double-side sliding and expanding structure has a faster expanding speed, such that the expanded area of the display device is increased, and the user experience is improved.

It is to be noted that in the double-side sliding and expanding embodiment, for each slide housing, the first direction is away from the fixed housing. For example, in the display device shown in FIG. 5, for the slide housing 12 on the left side of the fixed housing 11, the first direction f1 is the leftward direction of the fixed housing 11. Correspondingly, for the slide housing 12 on the right side of the fixed housing 11, the first direction f1 is the rightward direction of the fixed housing 11. Alternatively, the two slide housings 12 can slide relative to the fixed housing 11 in a direction parallel to a line connecting the two slide housings 12 on either side of the fixed housing 11.

In addition, the display device further includes a side fixed strip 191 and a fixed back housing 192. The side fixed strip 191 is disposed on the outer side of the second slideway 132 and is connected to the fixed housing 11, and the side fixed strip 191 is configured to increase the strength of the device and improve the appearance of the device. The fixed back housing 192 is disposed on a side, away from the planar display portion 151 of the flexible display panel, of the fixed housing 11, and the fixed back housing 192 is connected to the fixed housing 11 to protect the inner structure.

In some exemplary embodiments, the number of second slideways 132 in a slide assembly 13 is two, and the two second slideways 132 are disposed at two edges of the slide housing 12 in the second direction f2. In this structure, the two second slideways 132 restrict the two opposite edges of the flexible display panel 15 respectively, such that the possibility of the two edges having problems such as creasing and warping that affect the flatness of the flexible display panel is reduced.

It is also noted that in the case that the display device includes two slide housings and two slide assemblies, the two slide housings and the two slide assemblies include at least one of the slide assemblies and slide housings among a variety of slide assemblies and slide housings disclosed in embodiments of the present disclosure.

Figure 8:
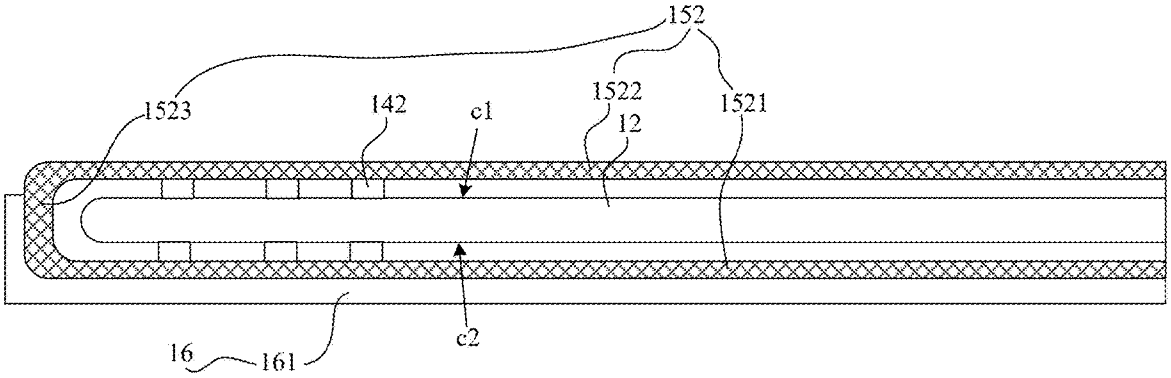
FIG. 8 is a schematic structural diagram of a side view of a portion of the structure of the display device illustrated in FIG. 5.

FIG. 8 is schematic structural diagram of a side view of a portion of the structure of the display device illustrated in FIG. 5 (the observation line of sight is parallel to the second direction). Referring to FIGS. 5 and 8, the display device further includes a cover plate 16, and the cover plate 16 is fixedly connected to the slide housing 12.

The cover plate 16 includes a back plate 161 disposed outside a side, away from the slide housing 12, of the first portion 1521 of the curved display portion 152. The back plate 161 is attached to the first portion 1521 of the curved display portion 152, and the first portion 1521 is a portion of the curved display portion 152 disposed on the second side c2 of the slide housing 12. Alternatively, the curved display portion 152 includes a second portion 1522 and a third portion 1523, the second portion 1522 is a portion of the curved display portion 152 disposed on the first side c1 of the slide housing 12, and the third portion 1523 is a portion of the curved display portion 152 disposed on an edge of the slide housing 12. The material of the cover 16 includes an aluminum alloy.

In one aspect, the cover plate 16 is configured to press the back, on the second side c2 of the slide housing 12, of the flexible display panel to avoid the flexible display panel from buckling. In the other aspect, the protection of the flexible display panel is increased to avoid the flexible display panel from being damaged by collision of other structures in the display device. For example, in the case that the display device is subjected to external impact, it avoids damages to the flexible display panel when some other structures in the display device are deformed under the effect of the impact. In this way, the service life of the flexible display panel is increased, the probability of damage is reduced, and the stability and reliability of the display device are improved.

In the display device according to some embodiments of the present disclosure, the fixed housing 11 is slidably connected to the slide housing 12, such that the slide housing 12 can drive the flexible display panel to be expanded or retracted. Correspondingly, the sliding connection of the fixed housing 11 and the slide housing 12 is realized by a variety of structures.

In some exemplary embodiments, referring to FIG. 5, the fixed housing 11 includes a plate body 111 and an open groove 112 disposed in the plate body 111. The third slideway 112*a* is disposed on a groove wall of the open groove 112, and the third slideway 112*a* extends in a direction parallel to the first direction f1.

The slide housing 12 further includes a third slide structure 126. The third slide structure 126 extends into the open groove 112 and is slidably connected to the third slideway 112*a*. The open groove 112 is configured to avoid the third slide structure 126 on the slide housing 12, such that the third slide structure 126 extends into the open groove 112 and is slidably connected to the third slideway 112*a*, and the structure can realize the sliding connection between the slide housing 12 and the fixed housing 11.

It should be noted that FIG. 5 is an exploded structural schematic diagram of a portion of the structure of the display device. The exploded structural schematic diagram refers to a schematic diagram in which portions of the structure of the display device are disassembled to r observe of the individual structures clearly. FIG. 8 is a structural schematic diagram of a side view of a portion of the structure of the display device shown in FIG. 5 in an assembled state. The assembled state refers to the state when the individual structures disassembled in FIG. 5 are assembled.

FIG. 5 illustrates a structure in which the fixed housing 11 is slidably connected to the slide housing 12, and the display device according to some embodiments of the present disclosure also includes other structures of the fixed housing 11 and the slide housing 12.

Figure 9:
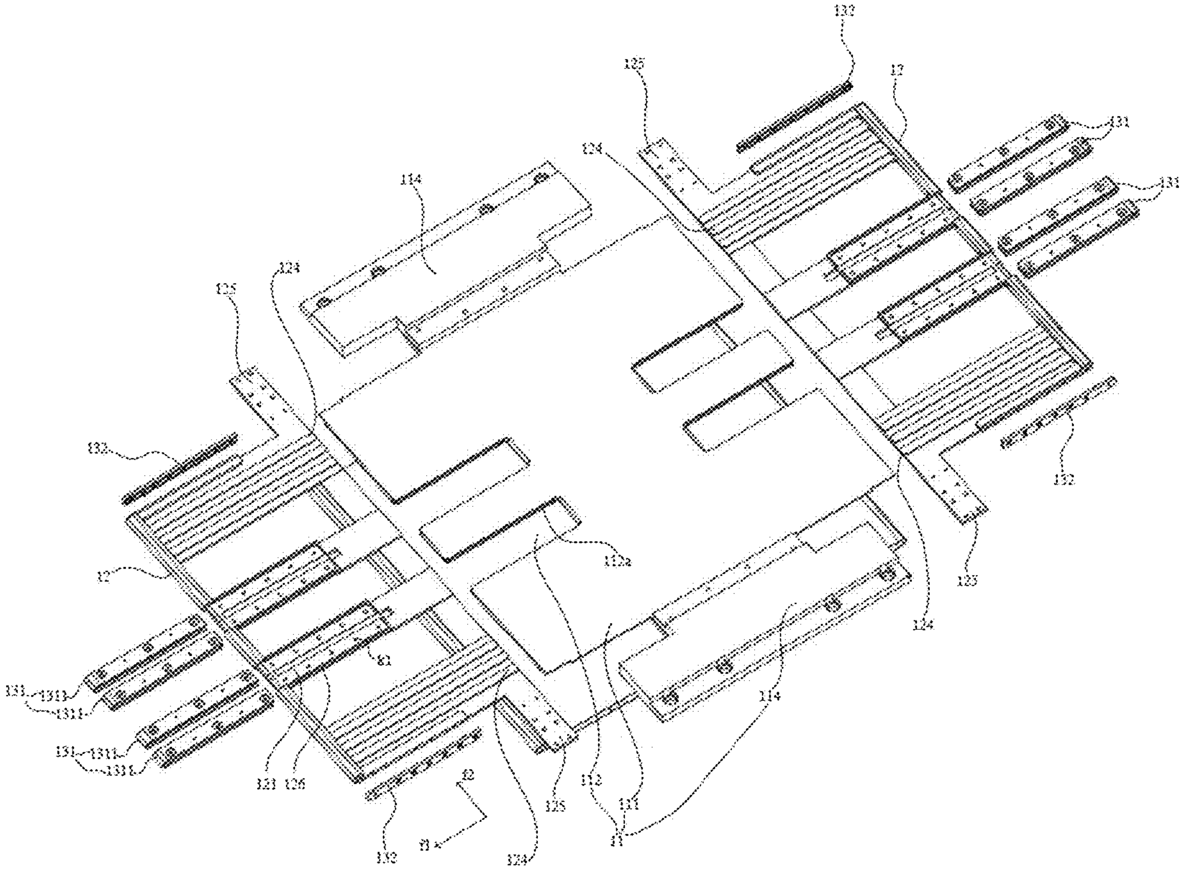
FIG. 9 is a schematic structural diagram of a portion of a structure of another display device according to some embodiments of the present disclosure.
Figure 10:
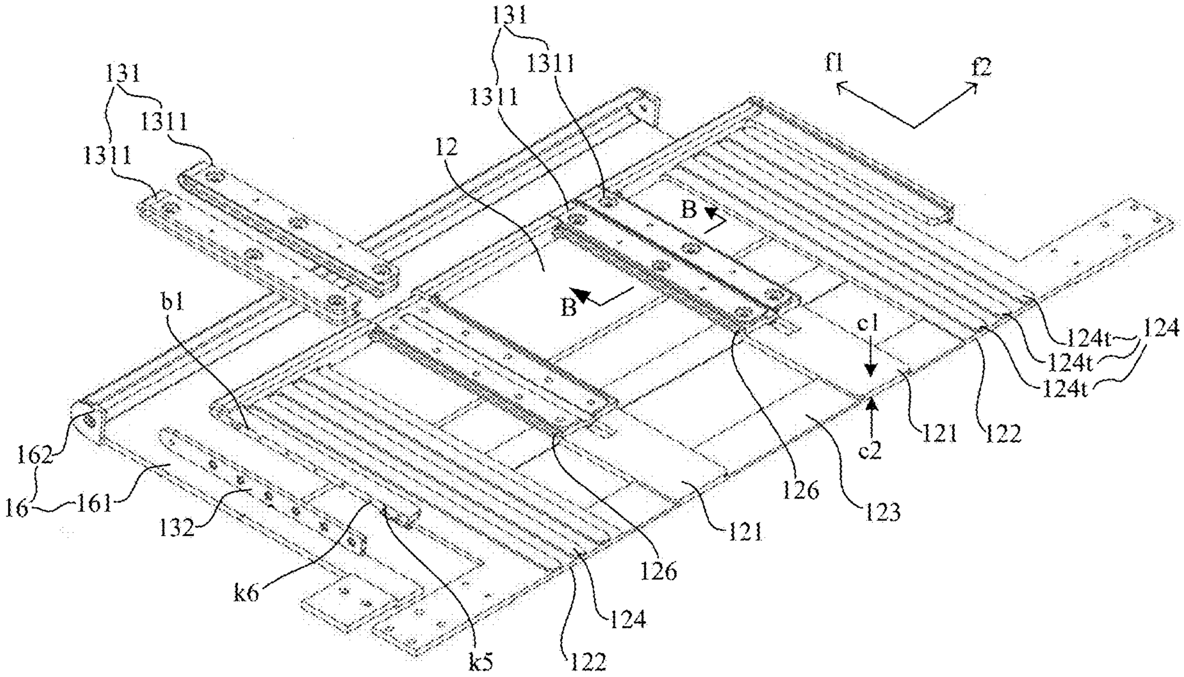
FIG. 10 is a schematic structural diagram of a slide housing of the display device illustrated in FIG. 9.
Figure 11:
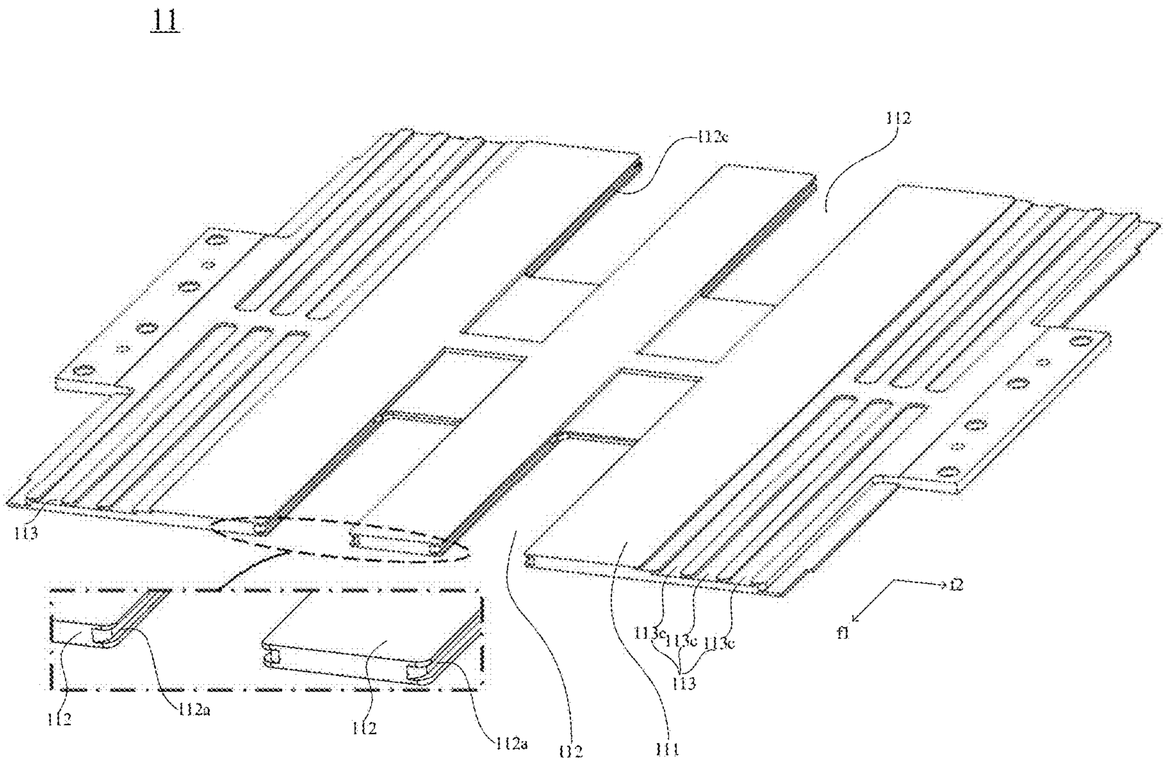
FIG. 11 is a schematic structural diagram of a fixed housing of the display device illustrated in FIG. 9.

Exemplarily, referring to FIG. 9, FIG. 9 is a schematic structural diagram of a portion of a structure in another display device according to some embodiments of the present disclosure. FIG. 10 is a schematic structural diagram of a slide housing of the display device illustrated in FIG. 9. FIG. 11 is a schematic structural diagram of the fixed housing of the display device illustrated in FIG. 9 (FIG. 11 is a schematic structural diagram of the other side of the fixed housing shown in FIG. 9 and an enlarged schematic structural diagram of some portions).

Referring to FIGS. 9, 10, and 11, the fixed housing 11 includes a plate body 111 and an open groove 112 disposed in the plate body 111, a third slideway 112*a* is disposed on the groove wall of the open groove 112, and the third slideway 112*a* extends in a direction parallel to the first direction f1.

The slide housing 12 further includes a third slide structure 126 and a first strip fixed plate 121. A length direction of the first strip fixed plate 121 is parallel to the first direction f1, the third slide structure 126 is disposed on a side of the first strip fixed plate 121, and the third slide structure 126 extends into the open groove 112 and is slidably connected to said third slideway 112*a*. This structure of arranging the slideway on the wall of the groove reduces the space occupied by the slideway and the corresponding slide structure, such that the miniaturization of the display device is realized and the space occupied by the display device is reduced, and it is easy for the user to carry and the user experience improved.

In some exemplary embodiments, referring to FIG. 11, the fixed housing 11 further includes a fourth slideway 113 disposed on a plate surface of the plate body 111, and the extension direction of the fourth slideway 113 is parallel to the first direction f1.

Referring to FIGS. 9 and 10, the slide housing 12 includes a fourth slide structure 124. The fourth slide structure 124 is assembled on the fourth slideway 113. The fourth slide structure 124 in the slide housing 12 fits with the fourth slideway 113 on the fixed housing to restrict the sliding connection between the slide housing 12 and the fixed housing 11, such that the flatness of sliding between the slide housing 12 and the fixed housing 11 is improved, the smoothness when the display device is expanded or retracted is enhanced, and the user experience is improved.

Specifically, the fourth slideway 113 may include a plurality of strip grooves 113*c* parallel to the first direction f1, and the fourth slide structure 124 includes a plurality of strip protrusions 124*t* parallel to the first direction f1, and the plurality of strip protrusions 124*t* are one-to-one engaged in the plurality of strip grooves 113*c*. Through the fit of the plurality of strip grooves 113*c* and the plurality of strip protrusions 124*t*, the flatness of sliding between the slide housing 12 and the fixed housing 11 is further improved, and the friction of sliding between the slide housing 12 and the fixed housing 11 is reduced, such that the smoothness of retracting and expanding the display device is further improved, and the user experience is improved.

In some exemplary embodiments, the slide housing 12 includes a second strip fixed plate 122 and a third strip fixed plate 123, the fourth slide structure 124 is disposed on the second strip fixed plate 122, and the extension direction of the second strip fixed plate 122 is parallel to the first direction f1, that is, the extension direction of the second strip fixed plate 122 is parallel to the extension direction of the strip protrusions 124*t* (belonging to the fourth slide structure 124) on the second strip fixed plate 122, such that the space occupied by the second strip fixed plate 122 and the fourth slide structure 124 is reduced to facilitate miniaturization of the display device.

The third strip fixed plate 123 is connected to the second strip fixed plate 122 and the first strip fixed plate 121. This structure reduces the mass of the slide housing 12 by arranging the various slide structures on different strip fixed plates, and then connecting and fixing the strip fixed plates with the various slide structures through other strip fixed plates to enhance the overall strength of the slide housing 12, realizing the effect of enhancing the lightness and portability of the display device while ensuring a certain strength of the structure. In addition, it is possible to avoid deformation of the slide housing 12 due to poor structural strength, which reduces the smoothness of the display device when being retracted or being expanded.

Figure 12:
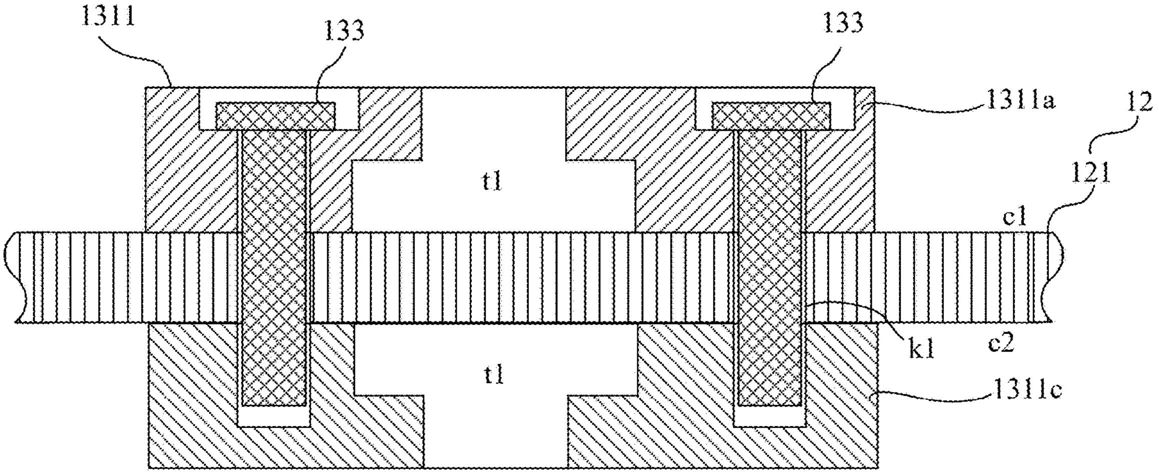
FIG. 12 is a schematic structural diagram of a cross-section of the display device illustrated in FIG. 10.
Figure 13:
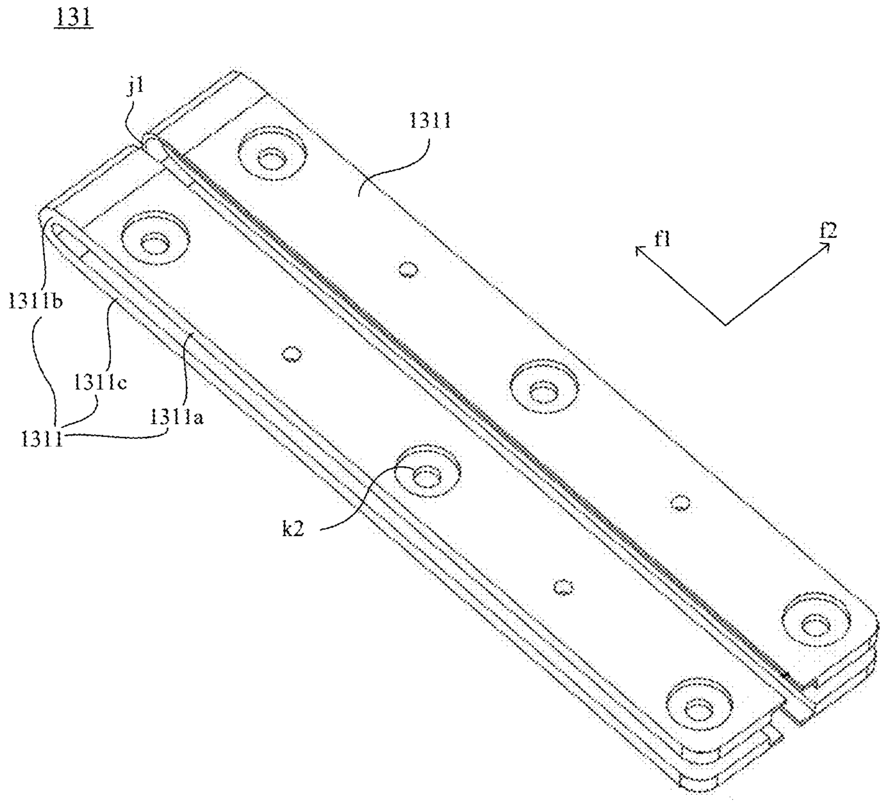
FIG. 13 is a schematic structural diagram of a first U-shaped plate of the structure illustrated in FIG. 12.

FIG. 12 is a schematic structural diagram of a cross-sectional of the display device illustrated in FIG. 10 (the cross-sectional position is at B-B in FIG. 10), and FIG. 13 is a schematic structural diagram of a first U-shaped plate of the structure illustrated in FIG. 12.

Referring to FIGS. 10, 12, and 13, the first slideway 131 includes two first U-shaped plates 1311, the structures of the two first U-shaped plates are the same or similar. The first U-shaped plate 1311 includes a first strip plate 1311*a*, a connection plate 1311*b*, and a second strip plate 1311*c*. The connection plate 1311*b* is connected to the first strip plate 1311*a* and the second strip plate 1311*c*, the first strip plate 1311*a* is disposed on the first side c1 of the slide housing 12, and the second strip plate 1311*b* is disposed on the second side c2 of the slide housing 12.

The two first U-shaped plates 1311 are arranged along the second direction f2, and a first spacing j1 is defined between the first U-shaped plates 1311 in the second direction f2. The two first U-shaped plates and the slide housing 12 enclose the T-shaped space t1. This structure constitutes a U-shaped track extending from the first side c1 of the slide housing 12 to the edge of the slide housing 12, and beyond the edge of the slide housing 12 till the second side of the slide housing 12. The first slide structure 141 disposed on the back of the flexible display panel slides in the U-shaped track to drive the flexible display panel to be expanded or retracted.

In some exemplary embodiments, the slide assembly 13 further includes a plurality of screws 133. The slide housing 12 includes a first strip fixed plate 121, and a plurality of first through holes are disposed in the first strip fixed plate 121. The plurality of screws 131 pass through the first strip plate 1311*a* in the first U-shaped plate 1311, the first through holes k1 in the first strip fixed plate 121 of the slide housing 12, and the second strip plate 1311*c* in the first U-shaped plate 1311, such that the first U-shaped plate 1311 is securely connected to the slide housing 12. This structure realizes a fixed connection structure between the first U-shaped plate 1311 and the slide housing 12. The first U-shaped plate 1311 and the slide housing 12 can be fixedly connected by other manners, such as bonding, welding, and snap-fitting, which is not limited in the embodiments of the present disclosure.

In some embodiments, a pit k2 is disposed on the first strip plate 1311*a*, a through-hole is disposed in the pit k2, and the screw 133 passes through the first strip plate 1311*a* through the through-hole in the pit k2. In this structure, the screw head of the screw 133 is hidden in the pit k2, avoiding the screw head of the screw 133 from being exposed, and avoiding the screw head of the screw 133 being exposed in the slide housing 12 when sliding the slide housing 11 relative to the fixed housing 12, which may have an effect on some structures in the display device.

In some exemplary embodiments, the first strip fixed plate 121 includes two plate surfaces opposite each other and side surfaces connected to the two plate surfaces, the first strip plate 1311*a* of the first U-shaped plate 1311 is disposed on an outer side of one of the two plate surfaces (which is a plate surface at the first side cl of the slide housing 12), and the second strip plate 1311*c* is disposed on the other of the two plate surfaces (which is a plate surface at the first side cl of the slide housing 12). In this way, the first U-shaped plate 1311 is fit with the first strip fixed plate 121 in order to realize the mounting and fixing of the first U-shaped plate 1311.

In some embodiments, the length direction of the first U-shaped plate 1311 is parallel to the length direction of the first strip fixed plate 121, that is, the length direction of the first U-shaped plate 1311 and the length direction of the first strip fixed plate 121 are parallel to the first direction f1. Furthermore, the dimensions of the first U-shaped plate 1311 in the second direction f2 and the dimensions of the first strip fixed plate 121 in the second direction f2 are identical or similar, such that the first U-shaped plate 1311*is* overlapped with the first strip fixed plate 121, the space occupied by the first U-shaped plate 1311 and the first strip fixed plate 121 is reduced, and miniaturization of the display device is promoted. Alternatively, the length of the first U-shaped plate 1311 and the length of the first strip fixed plate 121 are identical, or, the length of the first U-shaped plate 1311 is smaller than the length of the first strip fixed plate 121, which is not limited in the embodiments of the present disclosure.

The material of the slide housing 12 and the slide assembly 13 involved in the present disclosure embodiments includes an aluminum alloy or other materials, which are not limited in the embodiments of the present disclosure.

The above FIG. 5 illustrates a structure of the back housing, and the back housing can be other structures in the display device according to some embodiments of the present disclosure. Exemplarily, FIG. 14 is a schematic structural diagram of a back shell of the structure illustrated in FIG. 10, and FIG. 15 is a schematic structural diagram of a side view of a portion of the structure of the display device illustrated in FIG. 10 (FIG. 15 illustrates a schematic diagram of a portion of the structure illustrated in FIG. 10 fixed with the flexible display panel).

Figure 14:
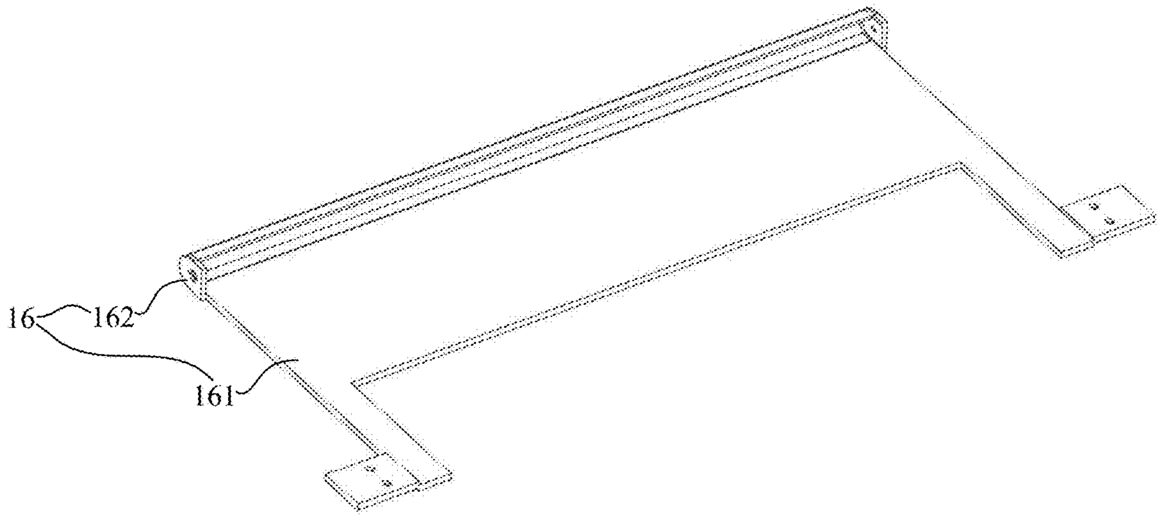
FIG. 14 is a schematic structural diagram of a back shell of the structure illustrated in FIG. 10.
Figure 15:
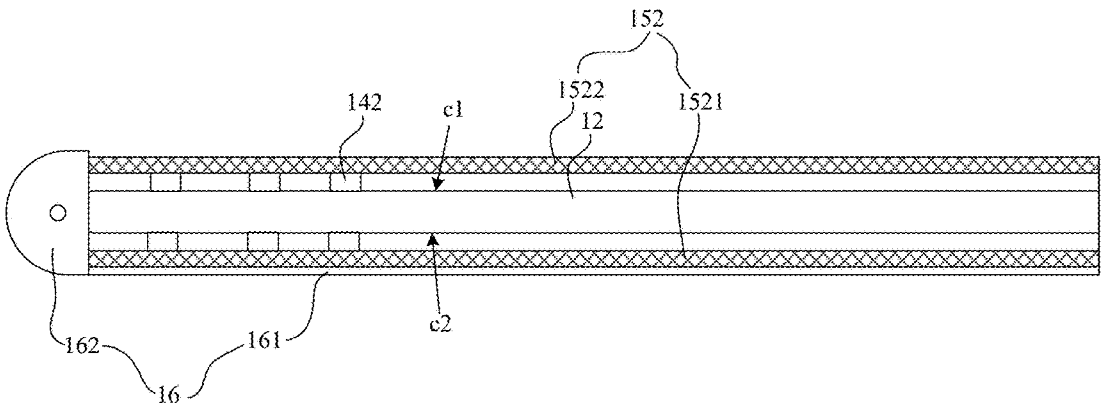
FIG. 15 is a schematic structural diagram of a side view of a portion of the structure of the display device illustrated in FIG. 10.

Referring to FIGS. 10, 14, and 15, the cover plate 16 further includes a curved portion 162, wherein the curved portion 162 is connected to an edge of the back plate 161. The curved portion 162 covers a portion of the curved display portion 152 covering an edge of the slide housing, that is, the curved display portion 152 includes a portion that covers an edge of the slide housing 12 (which can be referred to as the third portion 1523 in FIG. 8). The curved portion 162 is disposed outside of the portion and covers the portion. The curved portion 162 is configured to protect the portion of the curved display portion 152 covering the edge of the slide housing, and maintains the profile of the portion of the curved display portion 152 covering the edge of the slide housing, such that irregular deformation of the portion of the flexible display panel an at the edge of the slide housing is avoided, which interferes with the expanding and retracting of the display device.

It should be noted that, in order to clearly illustrating the respective structures, the flexible display panel is hidden in FIG. 10, and the flexible display panel is shown in FIG. 15, which is not limited in the embodiments of the present disclosure.

Figure 16:
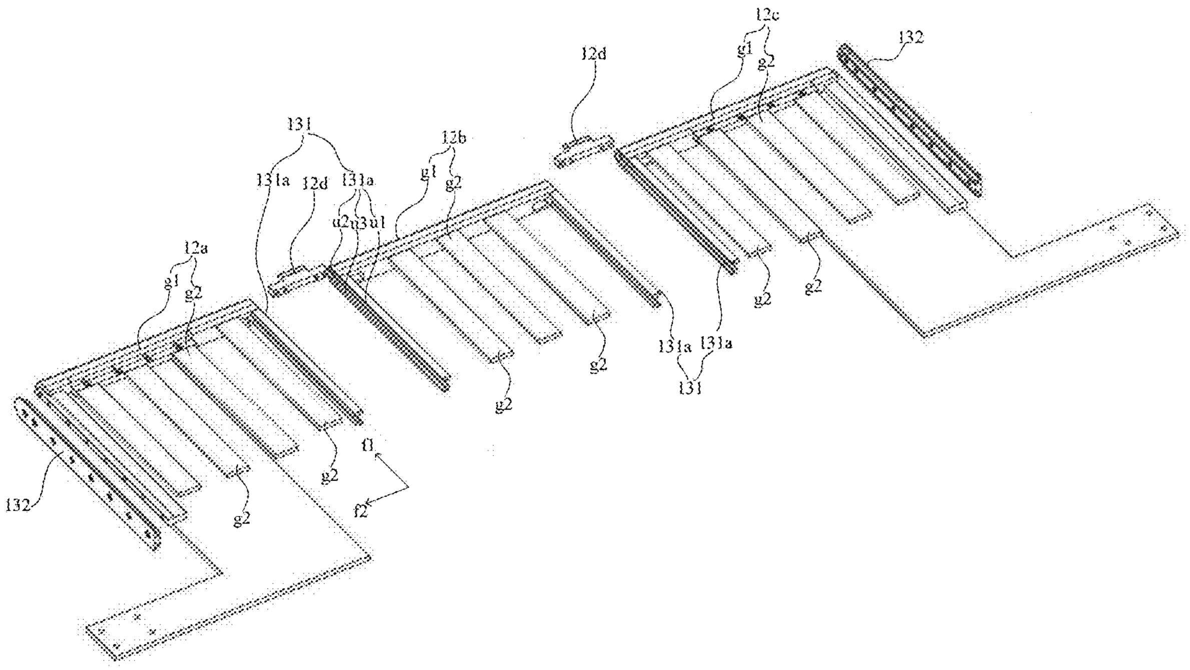
FIG. 16 is an exploded schematic structural diagram of another slide housing of the display device according to some embodiments of the present disclosure.

The above embodiments provide schematic structures of several slide housings of display devices, and the slide housings of the display devices according to some embodiments of the present disclosure can be other structures. Exemplarily, as shown in FIG. 16, which is an exploded structural schematic diagram of another slide housing of the display devices according to some embodiments of the present disclosure. The slide housings 12 include a first sub-housing 12*a*, a second sub-housing 12 *b*, and a third sub-housing 12*c*.

The first sub-housing 12*a* and the third sub-housing 12*c* are disposed on both sides of the second sub-housing 12*b*, and the second sub-housing 12*b* is connected to the first sub-housing 12*a* and the third sub-housing 12*c*. The number of the first slideway 131 is two, and the two first slideways 131 are disposed at a connection position between the first sub-housing 12*a* and the second sub-housing 12*b* and a connection position between the third sub-housing 12*c* and the second sub-housing 12*b* respectively.

Compared with the slide housing in the above embodiments, the slide housing shown in FIG. 16 is consisted of a plurality of sub-housings (e.g., the first sub-housing 12*a*, the second sub-housing 12*b*, and the third sub-housing 12*c*). This structure allows each of the sub-housings to be manufactured separately and assembled as the slide housing upon the manufacture of each of the sub-housings. In this way, the difficulty in the manufacture of the slide housing is reduced, and the manufacturing cost of the display device in the embodiments of the present disclosure is reduced.

The first sub-housing 12*a*, the second sub-housing 12*b*, and the third sub-housing 12*c* can be connected in a variety of manners. Exemplarily, the slide housing further includes two connectors 12*d*, and one of the two connectors 12*d* is disposed between the first sub-housing 12*a* and the second sub-housing 12*b* and is connected to the first sub-housing 12*a* and the second sub-housing 12*b* to realize the connection between the first sub-housing 12*a* and the second sub-housing 12*b*. The other of the two connectors 12 *d* is disposed between the third sub-housing 12*c* and the second sub-housing 12*b* and is connected to the third sub-housing 12*c* and the second sub-housing 12*b* to realize the connection between the third sub-housing 12*c* and the second sub-housing 12*b*.

The first sub-housing 12*a*, the second sub-housing 12*b*, and the third sub-housing 12*c* can be connected by other connection manners, such as bonding, bolting, welding, and snap-fitting. The connection between the first sub-housing 12*a* and the second sub-housing 12*b*, and the connection between the second sub-housing 12*b* and the third sub-housing 12*c* can be realized by at least one of the above multiple connection manners, which are not limited in the embodiments of the present disclosure.

In some exemplary embodiments, the first slideway 131 includes two second U-shaped plates 131*a*, the second U-shaped plate 131*a* includes a first strip plate u1, a connection plate u2, and a second strip plate u3. The connection plate u2 is connected to the first strip plate u1 and the second strip plate u3, the first strip plates u1 of the two second U-shaped plates 131*a* are parallel to each other, and the second U-shaped plates 131*a* of the two second U-shaped plates 131*a* are parallel to each other.

The connection plates u3 of the two second U-shaped plates 131*a* of one of the two first slideways 131 is connected to the edge of the first sub-housing 12*a* and the edge of the second sub-housing 12*b* respectively. The connection plates u2 of the two second U-shaped plates 131 *a* of the other first slideway 131 are connected to the edge of the third sub-housing 12*c* and the edge of the second sub-housing 12*b* respectively.

The structure of this second U-shaped plate 131*a* is similar to the structure of the first U-shaped plate in the above embodiments, and the second U-shaped plate 131*a* can form a U-shaped track. The U-shaped track extends from the first side c1 of the slide housing 12 to the edge of the slide housing 12, and across the edge of the slide housing 12 till the second side of the slide housing 12. The first slide structure disposed at the back of the flexible display panel can slid in the track to drive the flexible display panel to expand or retract.

Different from the first U-shaped plate in the above embodiments, the connection plate u2 of this second U-shaped plate 131*a* is connected to a sub-housing of the slide housing 12, and the connection plates u3 of the two second U-shaped plates 131*a* of one first slideway 131 are connected to two adjacent sub-housings respectively, such that the first slideway 131 is constituted in the case that the two adjacent sub-housings are connected. For example, the second U-shaped plate u2 of the U-shaped plate 131*a* is formed integrally with the connected sub-housings.

In some exemplary embodiments, each of the first sub-housing 12*a*, the second sub-housing 12*b*, and the third sub-housing 12*c* includes a linkage g1 and a plurality of restriction strips g2. One end of the plurality of restriction strips g2 is connected to the linkage g1, and the linkage g1 of the first sub-housing 12*a*, the linkage g1 of the second sub-housing 12*b*, and the linkage g1 of the third sub-housing 12*c* are end-to-end connected. That is, the linkage g1 of the first sub-housing 12*a*, the linkage g1 of the second sub-housing 12*b*, and the linkage g1 of the third sub-housing 12*c* are connected to form a linkage structure. Exemplarily, as described above, the linkage g1 of the first sub-housing 12*a*, the linkage g1 of the second sub-housing 12*b*, and the linkage g1 of the third sub-housing 12*c* are connected by two connectors 12 *d*. The linkage g1 of the first sub-housing 12*a*, the linkage g1 of the second sub-housing 12*b*, and the linkage g1 of the third sub-housing 12*c* are integral, which is not limited in the embodiments of the present disclosure.

Correspondingly, the fixed housing 11 includes a plate body and a plurality of strip grooves disposed in the plate body. The plurality of restriction strips g2 are one-to-one engaged in the plurality of strip grooves, and the length direction of the restriction strips g2 and the strip grooves are parallel to the first direction f1. The function of the restriction strips g2 is similar with the strip protrusions 124*t* in the above embodiments, and the strip grooves in the plate body are similar with the strip grooves 113*c* in the above embodiments. Through the plurality of restriction strips g2 fitting with the plurality of strip grooves, the flatness when sliding between the slide housing 12 and the fixed housing 11 is further improved, and the friction when sliding between the slide housing 12 and the fixed housing 11 is reduced, such that the smoothness of the display device when expanding and retracting is improved, and the user experience is improved.

Figure 17:
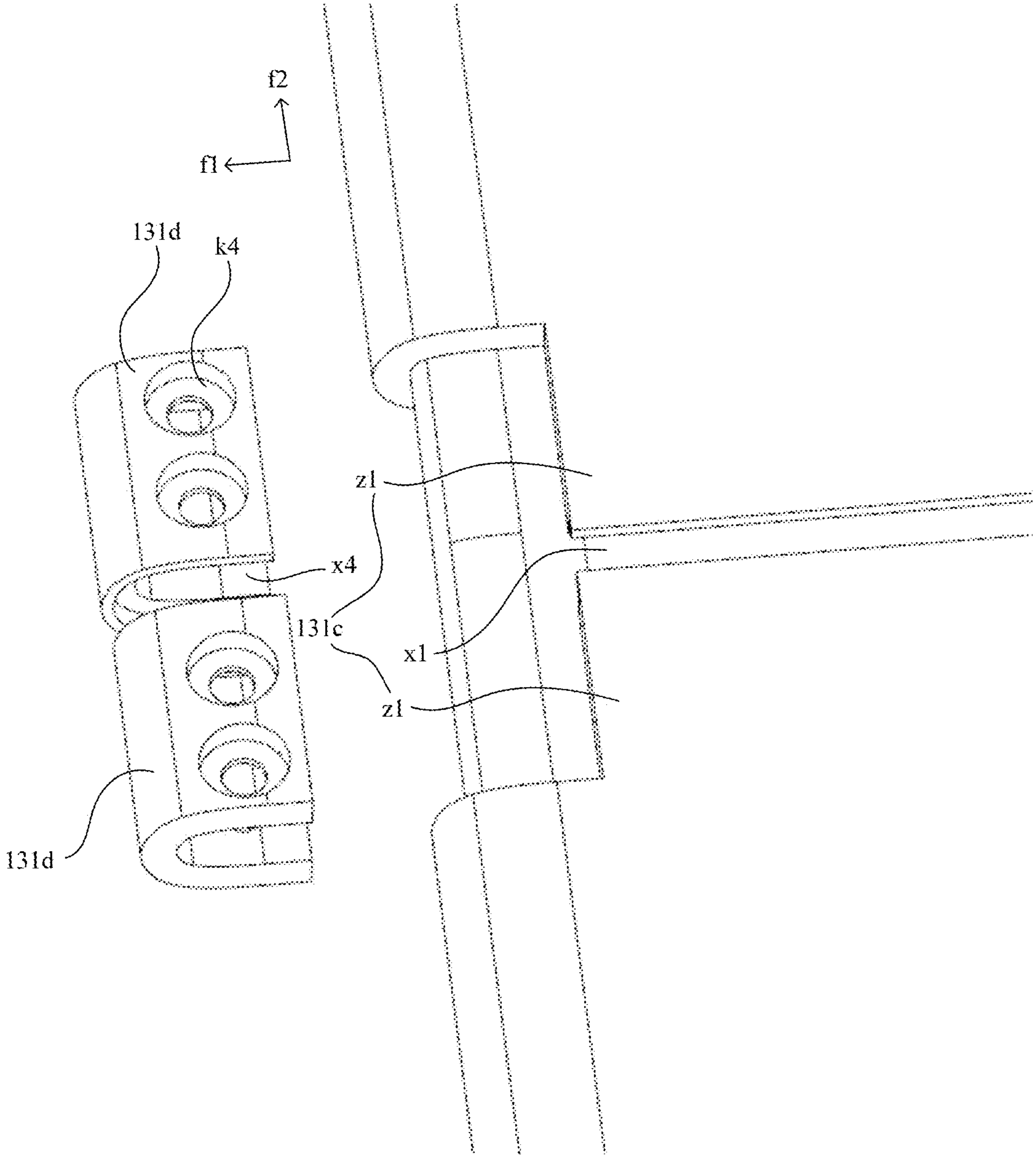
FIG. 17 is a schematic diagram of a disassembled structure of an enlarged structure of a portion of the region in the display device illustrated in FIG. 6.
Figure 18:
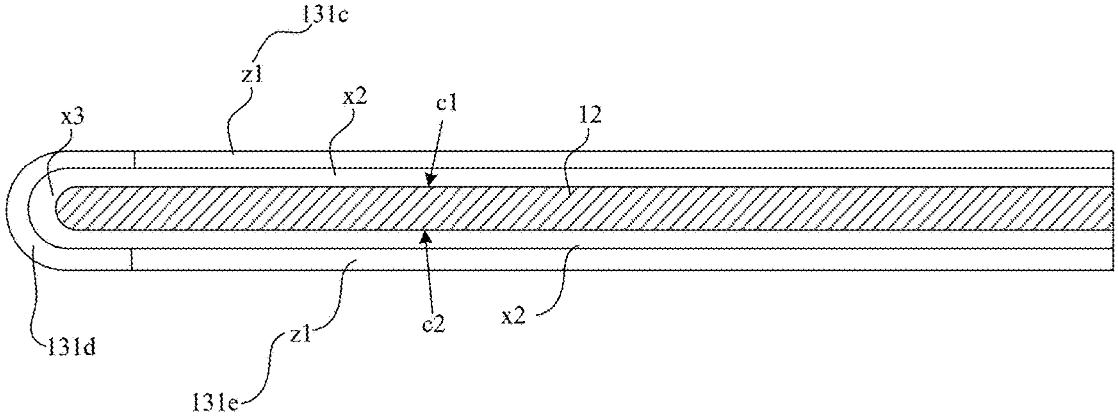
FIG. 18 is a schematic structural diagram of a cross-section of the display device illustrated in FIG. 6.

Some structures of the first slideway are provided in the above embodiments, and the first slideway can be other structures in the display device provided in the embodiments of the present disclosure. For example, FIG. 17 is a schematic diagram of a disassembled structure of an enlarged structure of a portion of the region in the display device illustrated in FIG. 6 (FIG. 17 is an enlarged disassembled structure of the region s1 of the display device illustrated in FIG. 6), and FIG. 18 is a schematic structural diagram of a cross-section of the display device illustrated in FIG. 6 (the cross-sectional position is at C-C). Referring to FIGS. 17 and 18, the first slideway 131 includes a first sub-slideway 131*c* disposed on the first side c1 of the slide housing 12, a second sub-slideway 131 *e* disposed on the second side c2 of the slide housing 12, and two third U-plate 131*d* covering the edges of the slide housing 12. The first sub-slideway 131*c* and the second sub-slideway 131*e* are parallel to the first direction f1, and the third U-shaped plates 131*d* are connected to the first sub-slideway 131*c* and the second sub-slideway 131*e*.

Each of the first sub-slideway 131*c* and the second sub-slideway 131*e* includes two strip support plates z1. A first gap x1 is disposed between the two strip support plates z1 in the second direction f2, and the two strip support plates z1 are parallel to each other. A second gap x2 is disposed between the two strip support plates z1 and the slide housing 12. A third gap x3 is disposed between the third U-type plate 131*d* has and an edge of the slide housing 12. A fourth gap x4 is disposed between the two third U-type plates 131*d*.

The second gap x2 between the two strip support plates z1 and the slide housing 12 and the third gap x3 between the third U-shaped plate 131*d* and the edge of the slide housing 12 form a space with a T-shaped cross-section similar to that in the above embodiment. The T-shaped slide structure matched to the space of the first slide structure is disposed in the space, and one end of the T-shaped slide structure can slid in the first slideway through the second gap x2 between the two strip support plates z1 in the second direction f2 and the fourth gap x4 between the two third U-shaped plates 131*d*. Different from the first slideway in the above embodiments, a third U-shaped plate is divided from the first slideway shown in FIG. 17 at an edge of the slide housing 12, and compared to the first slideway in the above embodiments, the first slideway in this structure has a smaller curved components with a curved structure (the third U-shaped plate is smaller than the second U-shaped plate and the first U-shaped plate in the above embodiments), which improves the processing performance of the curved structure and reduces the manufacturing cost. Furthermore, the first sub-slideway 131*c* and the second sub-slideway 131*e* in this structure are straight slideways, and this structure can improve the processing accuracy of the first sub-slideway 131*c* and the second sub-slideway 131*e*.

In some embodiments, a fixing through-hole k4 is disposed in the third U-shaped plate 131*d*, and the third U-shaped plate 131*d* is first clamped to the slide housing, and the third U-shaped plate 131*d* is fixed to the slide housing 12 by screwing with the fourth through-hole k4. The third U-shaped plate 131*d* can also be fixed to the slide housing 12 by other manners, such as bonding, welding, which are not limited in the embodiments of the present disclosure.

Figure 19:
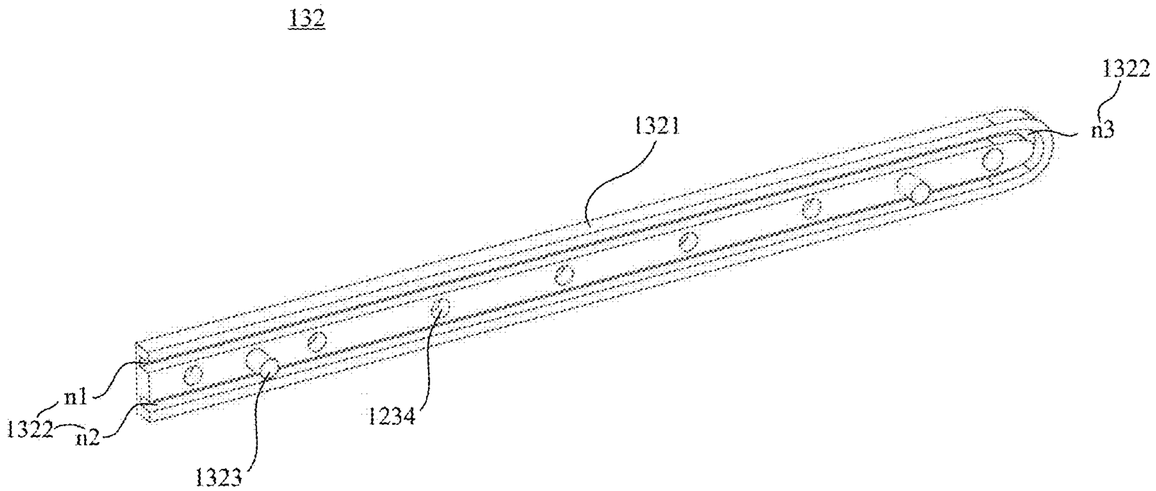
FIG. 19 is a schematic structural diagram of a second slideway of the display device illustrated in FIG. 10.

In the display device according to some embodiments of the present disclosure, the second slideway includes a variety of structures. For example, FIG. 19 is a schematic structural diagram of a second slideway of the display device illustrated in FIG. 10. Referring to FIGS. 10 and 19. the second slideway 132 includes a slideway body 1321 and a U-type groove 1322 disposed on the slideway body 1321. The U-type groove 1322 includes a first portion n1, a second portion n2, and a third portion n3 connected to the first portion n1 and the second portion n2. The first portion n1 and the second portion n2 are parallel to the first direction f1, the third portion n3 is disposed at an end, away from the fixed housing 11, of the slideway body 1321, and the slideway body 1321 is connected to an edge of the slide housing 12.

The first portion n1 and the second portion n2 of the U-shaped groove 1322 are straight portions of the U-shaped groove 1322, and the third portion n3 is a curved portion of the U-shaped groove 1322. The second slide structure is connected to the U-shaped groove 1322 and slid in the U-shaped groove 1322 under the restriction of the U-shaped groove 1322, and the flexible display panel is driven to be expanded or retracted.

In some embodiments, positioning holes and screw holes are disposed in the edge b2 of the slide housing 12. The second slideway 132 further includes fixing screws (not illustrated in FIGS. 10 and 19), positioning protrusions 1323 disposed on the slideway body 1321, and fixing through-holes 1324. The positioning protrusions 1323 are disposed in the positioning holes k5 of the edge b2 of the slide housing 12, and the fixing screws pass through the fixing through-holes 1324 in the slideway body 132 and are threadedly connected to the screw holes k6 in the edge b2 of the slide housing 12. The positioning protrusions 1323 have the rough positioning function during the installation of the second slideway 132. In the case that the positioning protrusions 1323 on the second slideway 132 is inserted into the positioning holes k5 in the edge b2 of the slide housing 12, the second slideway 132 is fixed to the edge b2 of the slide housing 12 by the screws. The second slideway 132 can be fixed to the slide housing 12 by other manners, such as bonding, welding, and snap-fitting, which are not limited in the embodiments of the present disclosure.

Figure 20:
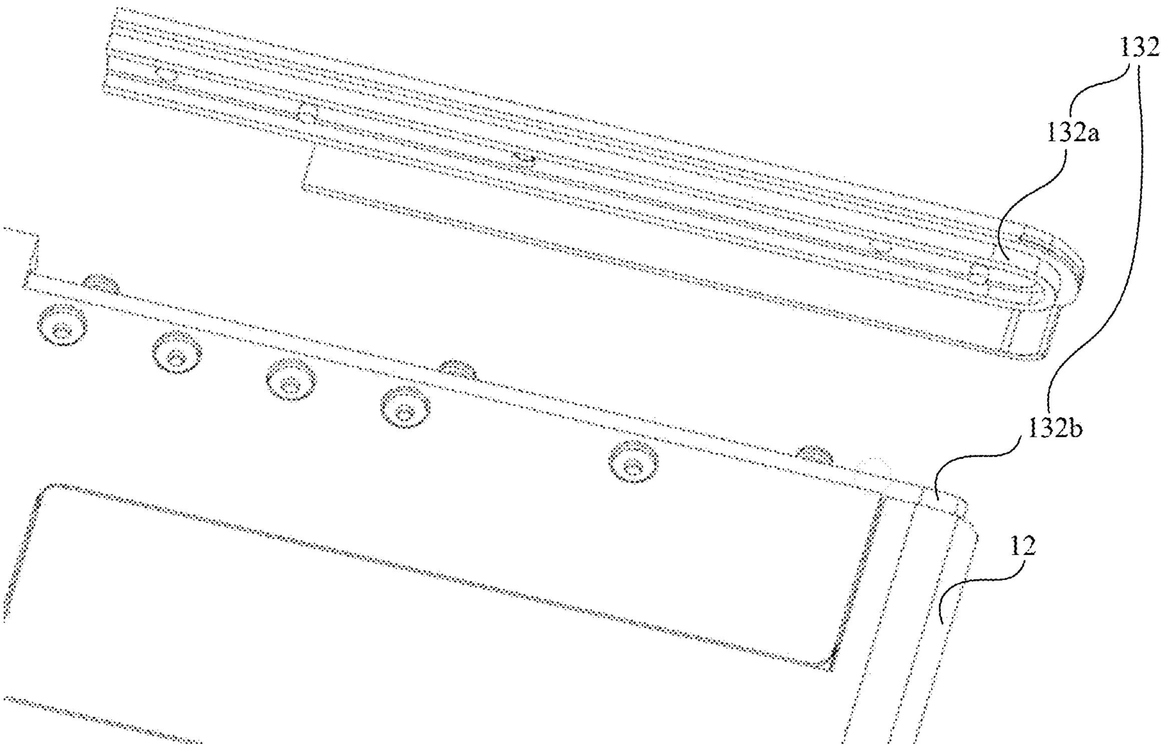
FIG. 20 is a schematic diagram of an enlarged structure of a portion of the region in the display device illustrated in FIG. 6.

The second slideway of the display device according to the embodiments of the present disclosure can have other structures. For example, FIG. 20 is a schematic diagram of an enlarged structure of a portion of the region in the display device illustrated in FIG. 6 (FIG. 20 is an enlarged structural schematic diagram of the region q3 in FIG. 6). Referring to FIGS. 6 and 20, the second slideway 132 includes an outer slideway 132*a* and an inner slideway 132*b*. The inner slideway 132*b* is disposed at an edge of the slide housing 12. The inner track 132*b* includes a strip protrusion, and the length direction of the strip protrusion is parallel to the first direction. The outer slideway 132*a* includes a U-shaped protrusion. The outer slideway 132*a* is connected to the inner slideway 132*b*. In the case that the outer slideway 132*a* is connected to the inner slideway 132*b*, the U-shaped protrusion is half-encircled outside the strip protrusion, and a space is disposed between the U-shaped protrusion and the strip protrusion, such that a U-shaped groove is formed in the second slideway similar to the U-shaped groove illustrated in FIG. 19. Similarly, the second slide structure can slid in the space formed by the U-shaped protrusion and the strip protrusion and drive the flexible display panel to expand or retract.

Figure 21:
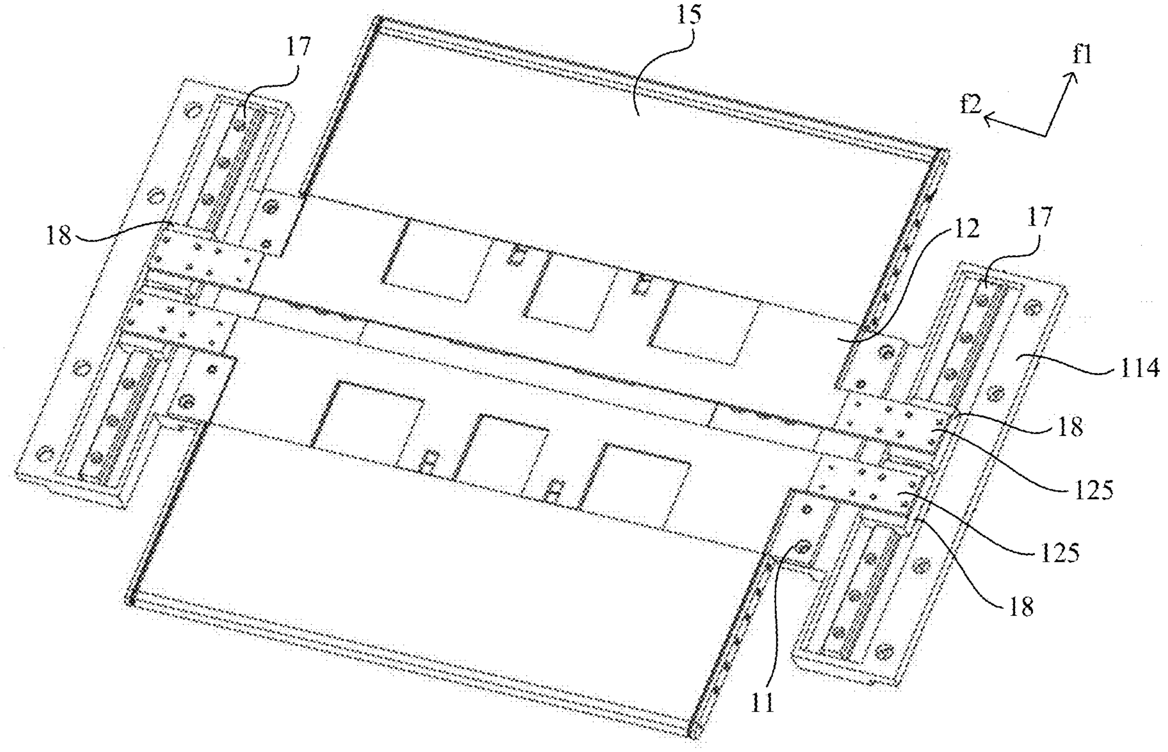
FIG. 21 is a schematic structural diagram of another side of a portion of the structure of the display device illustrated in FIG. 9.

FIG. 21 is a schematic structural diagram of another side of a portion of the structure of the display device illustrated in FIG. 9. Referring to FIGS. 9 and 21, the display device further includes a fifth slideway 17 and a slider 18. The fifth slideway 17 is disposed on the fixed housing 11, and the fifth slideway 17 extends in a direction parallel to the first direction f1. The slider 18 is fixedly connected the slide housing 12, and the slider 18 is assembled on the fifth slideway 17.

The slide housing 12 includes a first connection plate 125, and the slider 18 is fixedly connected to the connection plate 125. The fixed housing 11 includes a second connection plate 115, and the fifth slideway 17 is fixedly connected to the second connection plate 115. The slide structure formed by the slider 18 and the fifth slideway 17 is configured to further enhance the collimation of the sliding between the slide housing 12 and the fixed housing 11 and enhance the precision of expanding and retracting the display device.

In summary, the display device according to the embodiments of the present disclosure is provided with a slide assembly including a first slideway and a second slideway, the first slideway is connected to the first slide structure in the central region of the backside of the curved display portion of the display panel, and the second slideway is connected to the second slide structure in the edge region of the backside of the curved display portion of the display panel. In this structure, in the case that the display panel is expanded and retracted, the first slideway can fit with the first slideway structure to restrict the central region of the display panel and enhance the flatness of the central region of the display panel, and the second slideway can fit with the second slideway structure to restrict the edge region of the display panel and enhance the flatness of the edge region of the display panel, such that the problem of poor display effect of the display device in the related art is solved, and the display effect of the display device in improved.

The term "at least one of A and B" in the present application is merely a description of an association relationship of an associated object, indicating that three relationships exist. For example, at least one of A and B is represented as these three cases: only A is present, A and B are present, and only B is present. Similarly, "at least one of A, B, and C" indicates that seven relationships exist, and can be expressed as these seven cases: only A is present, only B is present, only C is present, A and B are present, A and C are present, C and B are present, and A, B, and C are present. Similarly, "at least one of A, B, C and D" indicates that fifteen relationships exist, and can be expressed as these fifteen cases: only A is present, only B is present, only C is present, only D is present, A and B are present, A and C are present, A and D are present, C and B are present, D and B are present, C and D are present, both D and C are present, A, B and C are present, A, B and D are present, A, C and D are present, B, C and D are present, and A, B, C and D are present.

It is to be noted that in the accompanying drawings, the dimensions of the layers and regions may be exaggerated for the clarity of illustration. And it should be understood that when an element or layer is referred to as being "on" another element or layer, it may be directly on the other element or an intermediate layer may be present. In addition, it should be understood that when the element or layer is referred to as being "under" another element or layer, it can be directly under the other element, or more than one intermediate layer or element can be present. It should also be understood that when a layer or element is referred to as being "between" two layers or elements, it may be the only layer between the two layers or elements, or more than one intermediate layer or element may also be present. Similar reference marks throughout indicate similar elements.

In the application, the terms "first", "second", "third", "fourth", and "fifth" are used for descriptive purposes only and are not to be construed as indicating or implying relative importance. The term "plurality" refers to two or more, unless otherwise expressly limited.

The foregoing are only optional embodiments of the present disclosure and are not intended to limit the application, and any modifications, equivalent substitutions, improvements, etc., within the spirit and principles of the present disclosure shall be included in the scope of protection of the present disclosure.

The invention claimed is:

1. A display device, comprising: a fixed housing,
at least one slide housing,
at least one slide assembly,
a connection assembly, and
a flexible display panel;
wherein the flexible display panel comprises a planar display portion and a curved display portion,
wherein
the planar display portion is connected to the fixed housing,
the curved display portion partially covers an edge, away from the fixed housing, of the slide housing,
one end of the curved display portion extends to a first side of the slide housing and is connected to the planar display portion, and
the other end of the curved display portion extends to a second side, opposite to the first side, of the slide housing;
the slide housing is slidably connected to the fixed housing, and
the slide housing is capable of sliding relative to the fixed housing in a first direction away from the fixed housing or in a direction opposite to the first direction;
the slide assembly comprises
a first slideway, including one first slideway and another first slideway; and
a second slideway, including one second slideway and another second slideway;
wherein the first slideway and the second slideway are disposed on the slide housing, and the first slideway and the second slideway extend from the first side to the second side of the slide housing; and
the connection assembly comprises a first slide structure and a second slide structure, wherein the first slide structure is connected to a central region on a backside of the curved display portion and is assembled on the second slideway, the central region comprises a middle point of the flexible display panel in a second direction, the edge region comprises an edge of the flexible display panel in the second direction, and the second direction is perpendicular to the first direction, wherein the first slideway and the slide housing form a T-shaped space at a first cross-section, the first slide structure comprises a T-shaped slide structure matching with the space, the T-shaped slide structure is disposed in the T-shaped space, and one end of the T-shaped slide structure is connected to the central region on the backside of the curved display portion, wherein the first cross-section is perpendicular to an extension direction of the first slideway, wherein each of the first U-shaped plates comprises a first strip plate, a connection plate, and a second strip plate, wherein the connection plate is connected to the first strip plate and the second strip plate, the first strip plate is disposed on the first side of the slide housing, and the second strip plate is disposed on the second side of the slide housing and the two first U-shaped plates are arranged along the second direction, a first spacing is defined between the first U-shaped plates in the second direction, and the two first U-shaped plates and the slide housing enclose the T-shaped space.

2. The display device according to claim 1, wherein the slide assembly further comprises a plurality of screws; and
the slide housing comprises a first strip fixed plate, wherein a plurality of first through holes are disposed in the first strip fixed plate;
wherein the plurality of screws pass through the first strip plate, the first through holes in the first strip fixed plate, and the second strip plate, such that the first U-shaped plate is connected to the slide housing.

3. The display device according to claim 1, wherein
the fixed housing comprises a plate body and an open groove disposed in the plate body, wherein a third slideway is disposed on a groove wall of the open groove, the third slideway extending in a direction parallel to the first direction; and
the slide housing further comprises a third slide structure, wherein the third slide structure extends into the open groove and is slidably connected to the third slideway.

4. The display device according to claim 3, wherein the slide housing comprises a first strip fixed plate; wherein
a length direction of the first strip fixed plate is parallel to the first direction, the first strip fixed plate has two plate surfaces opposite to each other and side surfaces connected to the two plate surfaces, the first strip plate of the first U-shaped plate is disposed on an outer side of one of the plate surfaces, and the second strip plate of the first U-shaped plate is disposed on an outer side of the other of the plate surfaces; and
the third slide structure is disposed on a side of the first strip fixed plate.

5. The display device according to claim 3, wherein the fixed housing further comprises a fourth slideway disposed on a plate surface of the plate body, wherein the fourth slideway extends in a direction parallel to the first direction; and the slide housing comprises a fourth slide structure, wherein the fourth slide structure is assembled on the fourth slideway.

6. The display device according to claim 5, wherein the fourth slideway comprises a plurality of strip grooves parallel to the first direction, and the fourth slide structure comprises a plurality of strip protrusions parallel to the first direction, wherein the plurality of strip protrusions are one-to-one engaged in the plurality of strip grooves.

7. The display device according to claim 5, wherein the slide housing comprises a second strip fixed plate and a third strip fixed plate, wherein the fourth slide structure is disposed on the second strip fixed plate, and the third strip fixed plate is connected to the second strip fixed plate and the first strip fixed plate.

8. The display device according to claim 1, wherein the slide housing comprises a first sub-housing, a second sub-housing, and a third sub-housing;

wherein the first sub-housing and the third sub-housing are disposed on both sides of the second sub-housing respectively, the second sub-housing is connected to the first sub-housing and the third sub-housing, a number of the first slideways is two, and the two first slideways are disposed at a connection position between the first sub-housing and the second sub-housing and a connection position between the third sub-housing at a connection position and the second sub-housing respectively.

9. The display device according to claim 8, wherein the first slideway comprises two second U-shaped plates, wherein each of the second U-shaped plates comprises a first strip plate, a connection plate, and a second strip plate, wherein the connection plate is connected to the first strip plate and the second strip plate, the first strip plates of the two second U-shaped plates are parallel to each other, and the second strip plates of the two second U-shaped plates are parallel to each other; and the connection plates of the two second U-shaped plates of the one first slideway are connected to an edge of the first sub-housing and an edge of the second sub-housing respectively, and the connection plates of the two second U-shaped plates of the other first slideway are connected to an edge of the third sub housing and an edge of the second sub-housing respectively.

10. The display device according to claim 8, wherein each of the first sub-housing, the second sub-housing, and the third sub-housing comprises a linkage and a plurality of restriction strips, wherein one end of the plurality of restriction strips is connected to the linkage, the linkage of the first sub-housing, the linkage of the second sub- housing, and the linkage of the third sub-housing are end-to-end connected; and the fixed housing comprises a plate body and a plurality of strip grooves disposed in the plate body, wherein the plurality of restriction strips are one-to-one engaged in the plurality of strip grooves, and length directions of the restriction strips and the strip grooves are parallel to the first direction.

11. The display device according to claim 1, wherein the first slideway comprises a first sub-slideway disposed on a first side of the slide housing, a second sub-slideway disposed on a second side of the slide housing, and two third U-plates covering edges of the slide housing; wherein the first sub-slideway and the second sub-slideway are parallel to the first direction, and the third U-plate is connected to the first sub-slideway and the second sub-slideway; and each of the first sub-slideway and the second sub-slideway comprises two strip support plates, wherein a first gap is defined between the two strip support plates in the second direction, the two strip support plates are parallel to each other, a second gap is defined between the two strip support plates and the slide housing, a third gap is defined between the third U-shaped plate and an edge of the slide housing, and a fifth gap is defined between the two third U-shaped plates.

12. The display device according to claim 1, wherein the second slideway comprises a slideway body and a U-shaped groove disposed on the slideway;

wherein the U-shaped groove comprises a first portion, a second portion, and a third portion connected to the first portion and the second portion, wherein the first portion and the second portion are parallel to the first direction, and the third portion is disposed at an end, away from the fixed housing, of the slideway body; and the slideway body is connected to an edge of the slide housing.

13. The display device according to claim 12, wherein positioning holes and screw holes are disposed in the edge of the slide housing; and the second slideway further comprises fixing screws, positioning protrusions disposed on the slideway body, and fixing through holes, wherein the positioning protrusions are disposed in the positioning holes, and the fixing screws pass through the fixing through holes in the slideway body and are threadedly connected to the screw holes in the edge of the slide housing.

14. The display device according to claim 12, wherein the second slideways are disposed at two edges of the slide housing in the second direction.

15. The display device according to claim 1, further comprising: a cover plate; wherein the cover plate is fixedly connected to the slide housing; and the cover plate comprises a back plate disposed outside a side, away from the slide housing, of a first portion of the curved display portion, wherein the back plate is attached to the first portion, and the first portion is a portion of the curved display portion disposed on the second side of the slide housing.

16. The display device according to claim 15, wherein the cover plate further comprises a curved portion, wherein the curved portion is coupled to an edge of the back plate, and the curved portion covers a portion of the curved display portion partially covering the edge of the slide housing.

17. The display device according to claim 1, wherein numbers of the slide assemblies and the slide housings are both two, wherein the first slideway and the second slideway of the two slide assemblies are disposed on the two slide housings respectively, and the two slide housings are disposed on two sides of the fixed housing.

18. The display device according to claim 1, further comprising:

a fifth slideway and a slider; wherein the fifth slideway is disposed on the fixed housing, and the fifth slideway extends in a direction parallel to the first direction; and the slider is fixedly connected to the slide housing, and the slider is assembled on the fifth slideway.

* * * * *